US008793643B2

(12) United States Patent
Nishio et al.

(10) Patent No.: US 8,793,643 B2
(45) Date of Patent: Jul. 29, 2014

(54) WIRING-DESIGN SUPPORT DEVICE, RECORDING MEDIUM FOR WIRING-DESIGN SUPPORT PROGRAM, AND METHOD FOR WIRING-DESIGN SUPPORT

(71) Applicant: Fujitsu Limited, Kawasaki (JP)

(72) Inventors: Yoshitaka Nishio, Yokosuka (JP); Kazunori Kumagai, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/625,300

(22) Filed: Sep. 24, 2012

(65) Prior Publication Data

US 2013/0125084 A1    May 16, 2013

(30) Foreign Application Priority Data

Nov. 15, 2011    (JP) ................................. 2011-249579

(51) Int. Cl.
*G06F 17/50*    (2006.01)

(52) U.S. Cl.
USPC ............ 716/137; 716/126; 716/130; 716/131

(58) Field of Classification Search
USPC .......................... 716/111, 112, 126–131, 137
See application file for complete search history.

(56) References Cited

U.S. PATENT DOCUMENTS

| | | | | |
|---|---|---|---|---|
| 5,850,349 A * | 12/1998 | Hirai et al. | ..................... | 716/124 |
| 6,789,243 B2 * | 9/2004 | Nakagawa et al. | ........... | 716/124 |
| 7,251,801 B2 * | 7/2007 | Ozawa et al. | .................. | 716/126 |
| 7,793,249 B1 * | 9/2010 | Wadland et al. | ............... | 716/129 |
| 8,006,219 B2 | 8/2011 | Nishio et al. | | |
| 8,060,849 B2 * | 11/2011 | He et al. | .......................... | 716/126 |
| 8,065,649 B2 * | 11/2011 | Hetzel et al. | ................... | 716/126 |
| 2004/0250230 A1 * | 12/2004 | Itou et al. | ......................... | 716/15 |
| 2009/0217230 A1 * | 8/2009 | He et al. | .......................... | 716/13 |
| 2009/0249265 A1 * | 10/2009 | Arata | ................. | 716/4 |
| 2011/0231808 A1 * | 9/2011 | Otsu et al. | ...................... | 716/129 |

FOREIGN PATENT DOCUMENTS

| | | |
|---|---|---|
| JP | 1-154531 | 6/1989 |
| JP | 3-237566 | 10/1991 |
| JP | 2002-124571 | 4/2002 |
| JP | 2005-309871 | 11/2005 |
| JP | 2009-122764 | 6/2009 |

\* cited by examiner

*Primary Examiner* — Nha Nguyen
(74) *Attorney, Agent, or Firm* — Staas & Halsey LLP

(57) ABSTRACT

A wiring-design support device supports wiring design of a printed circuit board. The processor executes a process that includes holding, in the memory, wiring information including information relating to a plurality of signal wires to be wired in parallel between two components on the printed circuit board, generating a wiring route illustrating a wiring area where the plurality of signal wires are wired between the two components and displaying the wiring route on a display unit based on the wiring information held in the holding. And the processor generates, upon or after the wiring route generated, a detailed wiring where each of the plurality of signal wires is wired along the wiring route based on the wiring route and a wiring rule included in the wiring information, and displaying the detailed wiring on the display unit along with the wiring route.

20 Claims, 25 Drawing Sheets

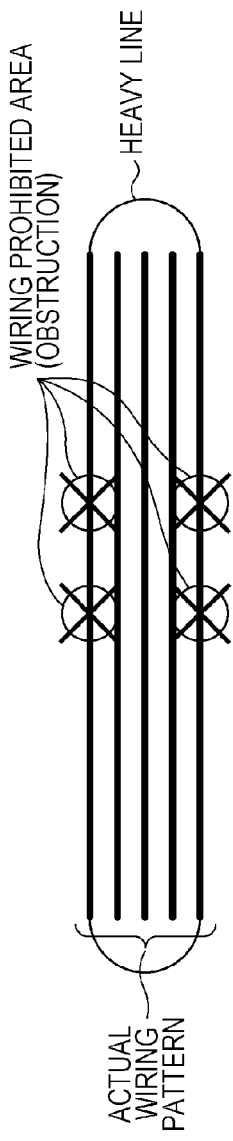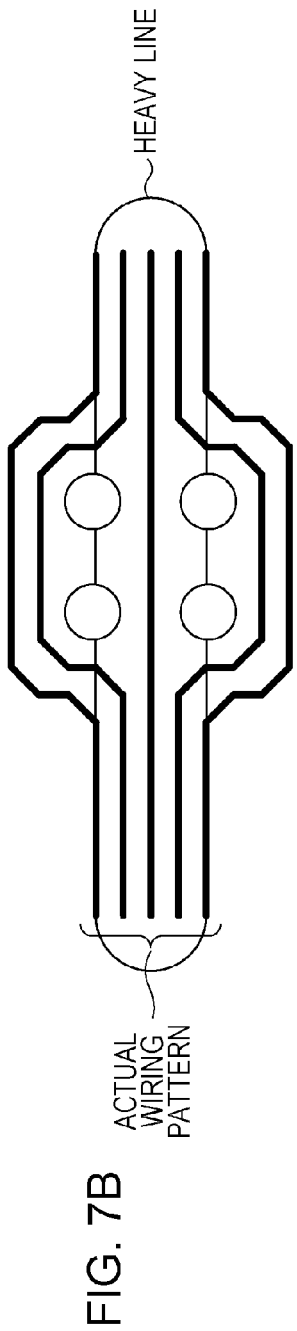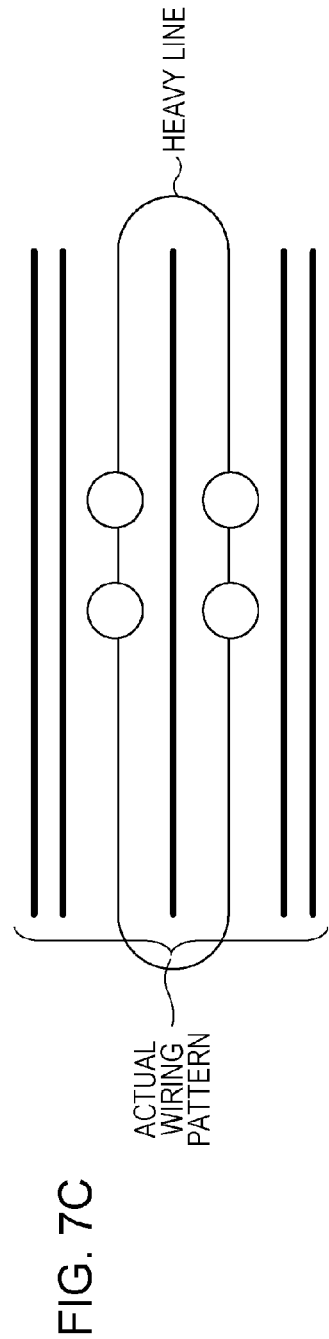

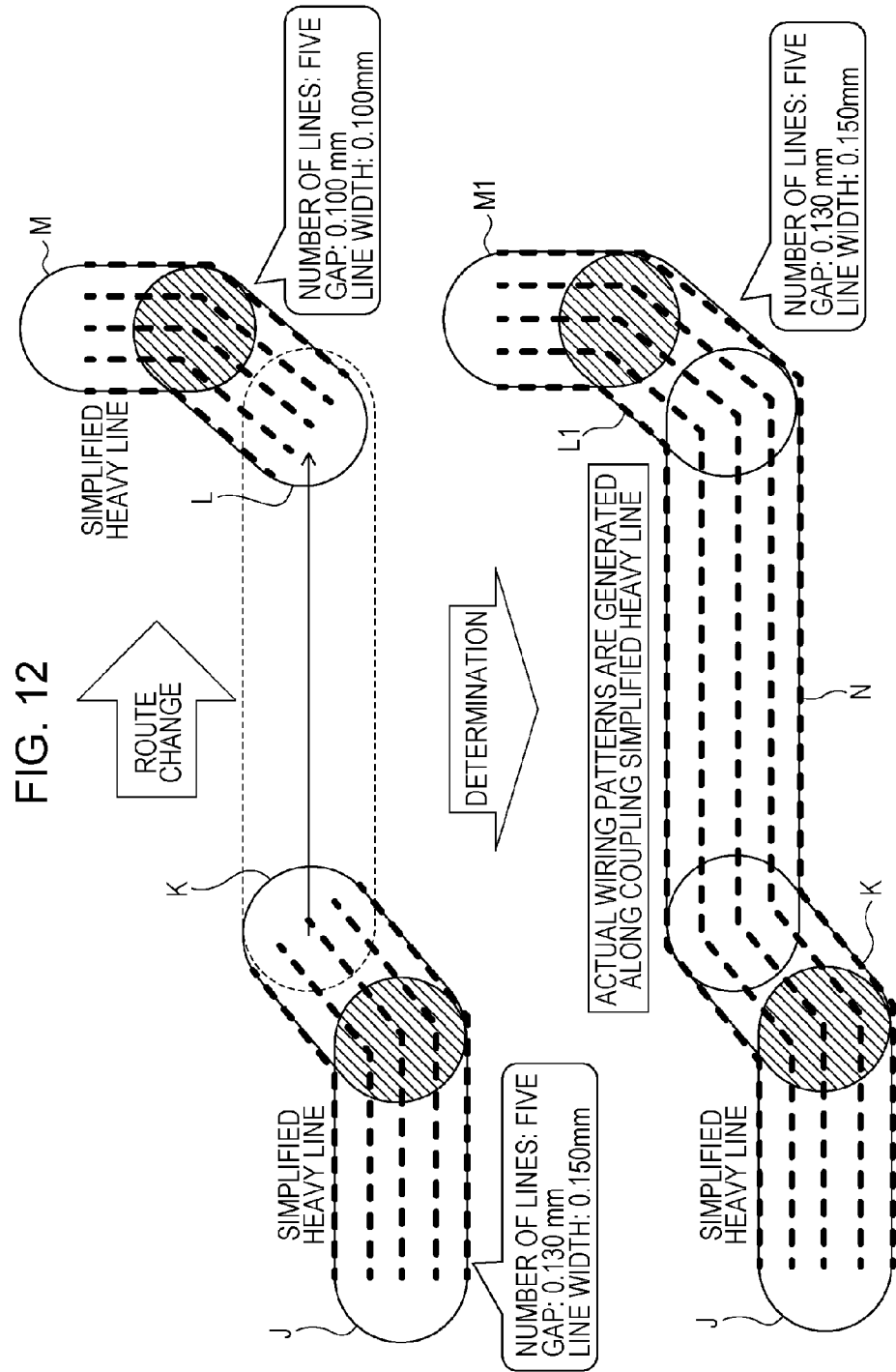

Lx LAYER ACTUAL
WIRING PATTERNS

Ly LAYER ACTUAL
WIRING PATTERNS

Lx LAYER ACTUAL
WIRING PATTERNS

Ly LAYER ACTUAL
WIRING PATTERNS

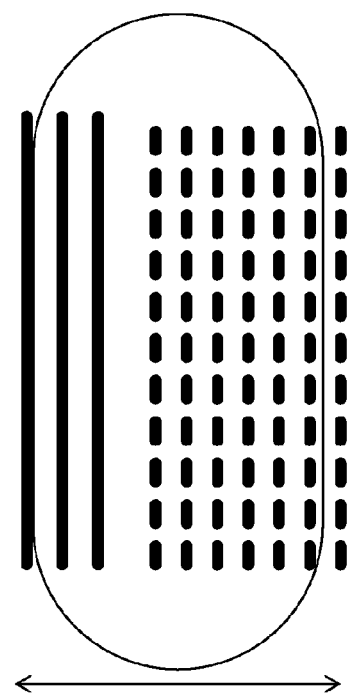
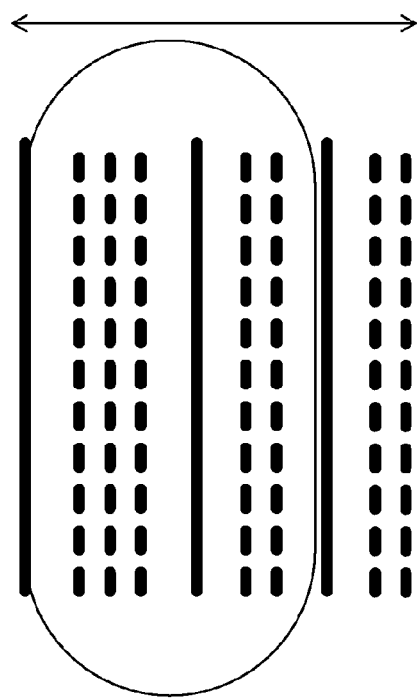

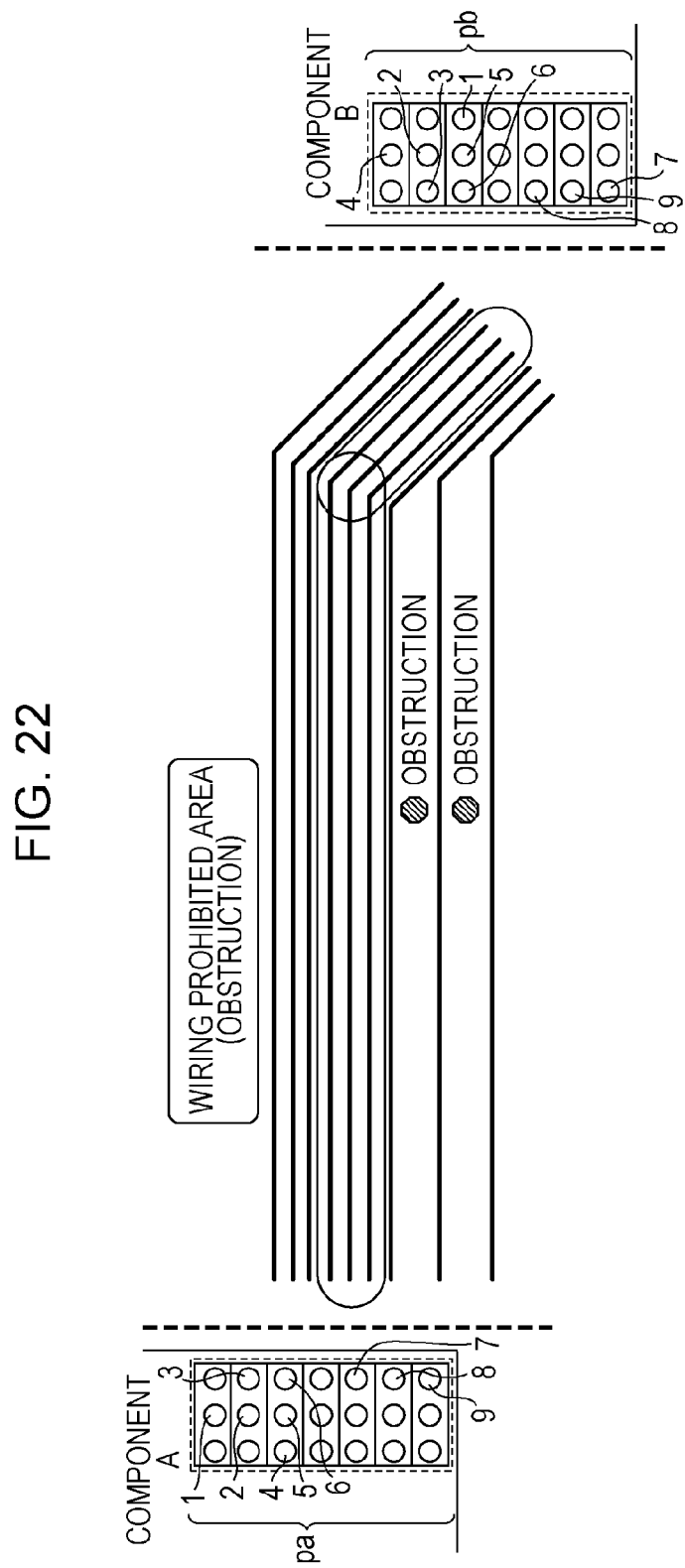

WIRING-DESIGN SUPPORT DEVICE, RECORDING MEDIUM FOR WIRING-DESIGN SUPPORT PROGRAM, AND METHOD FOR WIRING-DESIGN SUPPORT

CROSS-REFERENCE TO RELATED APPLICATION

This application is based upon and claims the benefit of priority of the prior Japanese Patent Application No. 2011-249579, filed on Nov. 15, 2011, the entire contents of which are incorporated herein by reference.

FIELD

The embodiment discussed herein is related to a wiring-design support device, a recording medium for a wiring-design support program, and a method for wiring-design support.

BACKGROUND

In recent years, the amount of information that circuit devices handle has steadily grown, and printed circuit boards have increased in scale accompanied therewith. Increase in scale of printed circuit boards has also increased wiring volume between component pins, and design work volume has also become great. As a technique for making wiring work itself more efficient, techniques for automating wiring on printed circuit boards have frequently been proposed. However, with an initial wiring study stage, it is more important than wiring itself to effectively verify physical channel capacity used for a signal to be wired, and to suitably evaluate the number of substrate layers and an area used for the scale of a circuit to be designed appropriately and in short time. In particular, in the event of having performed bus signal wiring wherein multiple signal wires (nets) are wired between two components on a printed circuit board by being bundled, upon performing correction on bus signal wiring results, the entirety of the bus signal wiring may have to be corrected, and accordingly, such evaluation and study is important.

For example, description will be made regarding an example of a conventional wiring design technique wherein, as illustrated in FIG. 24, wiring between component pins (terminals) pa of a component A and component pins (terminals) pb of a component B is performed on a printed circuit board. With the example illustrated in FIG. 24, wiring design is performed so that nine pins pa of the component A, and nine pins pb of the component B are connected by nine signal wires (nets). Here, six wires on the upper side (see solid lines) of the nine signal wires are signal wires to be wired in parallel conforming to a first wiring rule (line width, gap), and three wires on the lower side (see dotted lines) of the nine signal wires are signal wires to be wired in parallel conforming to a second wiring rule different from the first wiring rule.

With an example of the conventional wiring design technique illustrated in FIG. 24, in the event that signal wires are wired in parallel between the component A and component B, study is performed at each of Section 1, Section 2, and Section 3, and all of detailed wirings (actual patterns) from the component pins pa to the component pins pb are generated. With Section 1, study is performed regarding wiring for leading out nets from the component pins pa out of the component A in accordance with a net alignment sequence. Similarly, with Section 3, study is performed regarding wiring for leading out nets from the component pins pb out of the component B in accordance with the net alignment sequence. Also, with Section 2, study is performed regarding wiring capacitance for wiring nine nets while avoiding a wiring prohibited area (obstruction) out of the components A and B.

More specifically, with an example of the conventional wiring design technique illustrated in FIG. 24, after lead wiring is performed in Section 1 and Section 3, parallel wiring between lead wires in the components A and B, i.e., in Section 2 is performed, and all of the patterns from the component pins pa to the component pins pb are generated. The lead wiring in Section 1 and Section 3 takes time and trouble due to adjustment of net alignment sequences. On the other hand, in the event that leading out of nets is performed in the coordinated net alignment sequences in Section 1 and Section 3, parallel wiring to be performed in Section 2 is executed in short time with comparatively small time and effort.

At this time, in the event that lead wiring in Section 1 and Section 3 is automatically performed, the alignment sequence of the led out nets may frequently be against a designer's intention. In such a case, lead wiring in Section 1 and Section 3 is repeatedly performed, and consequently, it takes a great amount of time on lead wiring processing in Section 1 and Section 3.

Also, in the event that after all of the patterns from the component pins pa to the component pins pb are once generated, restudy of wiring is performed by changing the net alignment sequence, lead wiring in Section 1 and Section 3 has to be repeatedly performed each time thereof. Therefore, it takes a great amount of time for processing to generate all of the patterns.

Next, another example of a conventional wiring design technique will be described with reference to FIGS. 25A and 25B. With the example illustrated in FIGS. 25A and 25B as well, in the same way as with the example illustrated in FIG. 24, description will be made regarding a case where wiring is performed between the component pins pa of the component A, and the component pins pb of the component B. With the example illustrated in FIGS. 25A and 25B, first, as illustrated in FIG. 25A, a heavy line indicating the nine signal wires (nets) in a pseudo manner is automatically wired between the components A and B. Upon the heavy line being wired, the heavy-line wiring in FIG. 25A is, as illustrated in FIG. 25B, automatically converted into detailed wirings which connects the component pins pa of the component A, and the component pins pb of the component B. At this time, though various techniques can be conceived as a conversion technique into detailed wirings, many techniques connect the corresponding terminals pa and pb, and accordingly, detour wiring is performed wherein the alignment sequence of the terminals pa of the component A, and the alignment sequence of the terminals pb of the component B are taken into consideration. Note that, in FIG. 25B, only detailed wirings on the component A side are illustrated, and drawing of detailed wirings on the component B side is omitted.

Therefore, with the other example of a conventional wiring design technique illustrated in FIGS. 25A and 25B, the heavy-line wiring illustrated in FIG. 25A and the detailed wirings illustrated in FIG. 25B are not simultaneously displayed. That is to say, the designer does not perform study with reference to the heavy-line wiring illustrated in FIG. 25A and the detailed wirings illustrated in FIG. 25B simultaneously, and does not perform study of wiring capacitance strictly.

Also, it takes a great amount of time to perform detour wiring processing on the component A side and component B side. Further, in the event that after performing conversion from the heavy-line wiring to the detailed wirings, change of the detailed wirings is performed, each time thereof, processing has to be repeatedly performed wherein heavy-line wiring is performed, detour wiring is performed, and conversion into detailed wirings is performed. Therefore, even with the technique illustrated in FIGS. 25A and 25B, it takes a great amount of time to perform processing for generating all of the patterns.

Japanese Laid-open Patent Publication Nos. 2002-124571, 03-237566, 01-154531, 2005-309871, and 2009-122764 are examples of the related art.

SUMMARY

According to an aspect of the invention, a wiring-design support device that supports wiring design of a printed circuit board, includes a processor and a memory coupled to the processor. The processor holds, in the memory, wiring information including information relating to a plurality of signal wires to be wired in parallel between two components on the printed circuit board. The processor generates a wiring route illustrating a wiring area where the plurality of signal wires are wired between the two components and displaying the wiring route on a display unit based on the wiring information held in the holding, prior to processing for wiring a lead wire to be led out from each component terminal of the two components to out of each component and to be connected to edge portions of the plurality of signal wires. And the processor generates, upon or after the wiring route generated by the wiring route generating, a detailed wiring where each of the plurality of signal wires is wired along the wiring route based on the wiring route and a wiring rule included in the wiring information, and displays the detailed wiring on the display unit along with the wiring route.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 7A through 7C are diagrams for describing a heavy-line pasting mode and a shape quality mode of obstruction detour wiring;

FIG. 12 is a diagram for describing a coupling technique between a simplified heavy line and a simplified heavy line;

FIG. 16A is a diagram illustrating an example wherein actual wiring patterns have been generated in the random mode, and FIG. 16B is a diagram illustrating an example wherein actual wiring patterns have been generated in the compact mode;

FIG. 22 is a diagram illustrating an example wherein actual wiring patterns have been generated and displayed from a heavy line, regarding the example illustrated in FIG. 20;

DESCRIPTION OF EMBODIMENT

Hereinafter, an embodiment will be described with reference to the drawings.

1. Configuration of Wiring-design Support Device According to Present Embodiment FIG. 1 is a block diagram illustrating the hardware configuration and function configuration of a wiring-design support device according to the present embodiment.

Figure 1:
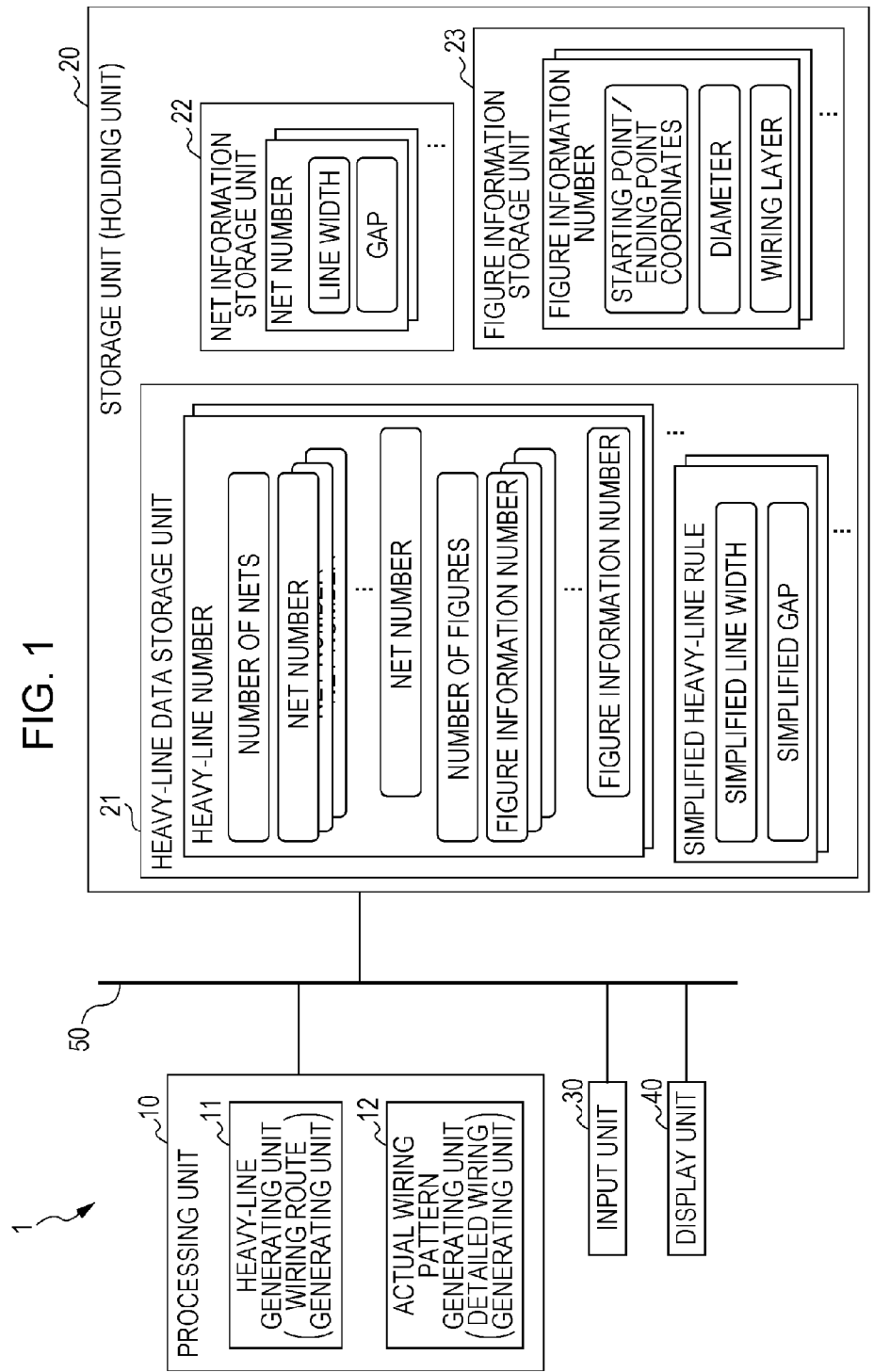
FIG. 1 is a block diagram illustrating the hardware configuration and function configuration of a wiring-design support device according to the present embodiment.

The wiring-design support device 1 illustrated in FIG. 1 supports wiring design of a printed circuit board, and is configured of a computing machine such as a common personal computer or the like, and includes a processing unit 10, a storage unit 20, an input unit 30, and a display unit 40. These processing unit 10, storage unit 20, input unit 30, and display unit 40 are mutually connected via a bus so as to be communicable.

The processing unit 10 is a CPU (Central Processing Unit) or the like. The storage unit 20 may be an internal storage device such as RAM (Random Access Memory), ROM (Read Only Memory), HDD (Hard Disk Drive), SSD (Solid State Drive), or the like, or may be an external storage device. The input unit 30 is a man-machine interface which is operated by a designer (user) to input various types of information to the present device 1, for example, such as a mouse, keyboard, or the like. Particularly, with the present embodiment, the input unit 30 is used for the designer inputting information used for wiring design on the printed board with reference to the display unit 40. The display unit 40 displays various types of information generated at the processing unit 10, e.g., a later-described heavy line or actual wiring patterns, and is a display such as a CRT (Cathode Ray Tube), LCD (Liquid Crystal Display), or the like.

The processing unit 10 executes a wiring-design support program held in the storage unit 20 or external storage device or the like, thereby accomplishing functions as a heavy-line generating unit 11 and an actual wiring pattern generating unit 12, which will be described later.

The storage unit (holding unit) 20 to which wiring information including information regarding multiple signal wires (nets) to be wired in parallel between two components on a printed circuit board is set holds this wiring information, and includes a heavy-line data storage unit 21, a net information storage unit 22, and a figure information storage unit 23, which will be described later. Note that storage units 21, 22, and 23 may not be provided onto the same memory, but may be provided onto different memory.

Now, description will be made below regarding information to be held in each of the heavy-line data storage unit 21, net information storage unit 22, and figure information storage unit 23, in the storage unit 20.

The heavy-line data storage unit 21 holds data regarding heavy lines to be generated by a later-described heavy-line generating unit 11.

The heavy lines are, as illustrated in FIGS. 2, 3, and 20 through 23, wiring routes schematically illustrating a wiring area where multiple nets are wired between two components. A heavy line is, with between two components specified by the designer, generated by the heavy-line generating unit 11 using automatic or manual figure editing. A heavy line is displayed on the display unit 40 in a state in which multiple route figures are connected. Each route figure is formed of two semicircles having the same diameter which are disposed so as to face both edge portions, and two straight lines that connect the semicircles of these both edge portions. Accordingly, the position and shape of each route figure are specified with the center coordinates of semicircles at both edges (starting point coordinates and ending point coordinates), and the diameters of the semicircles, i.e., the interval (width) of the above two straight lines. Also, adjacent two route figures making up one heavy line are connected in a manner overlapped with the semicircle portions of the edge portions, and make up, for example, an angle in increments of 45 degrees (one of 45 degrees, 90 degrees, 135 degrees, 225 degrees, 270 degrees, and 315 degrees) with the present embodiment.

With the heavy-line data storage unit 21, heavy-line data (wiring information) such as the number of nets, net numbers, the number of figures, figure information numbers, and so forth is held in a manner correlated with a heavy-line number specifying each heavy line as heavy-line data regarding each heavy line.

Figure 2:
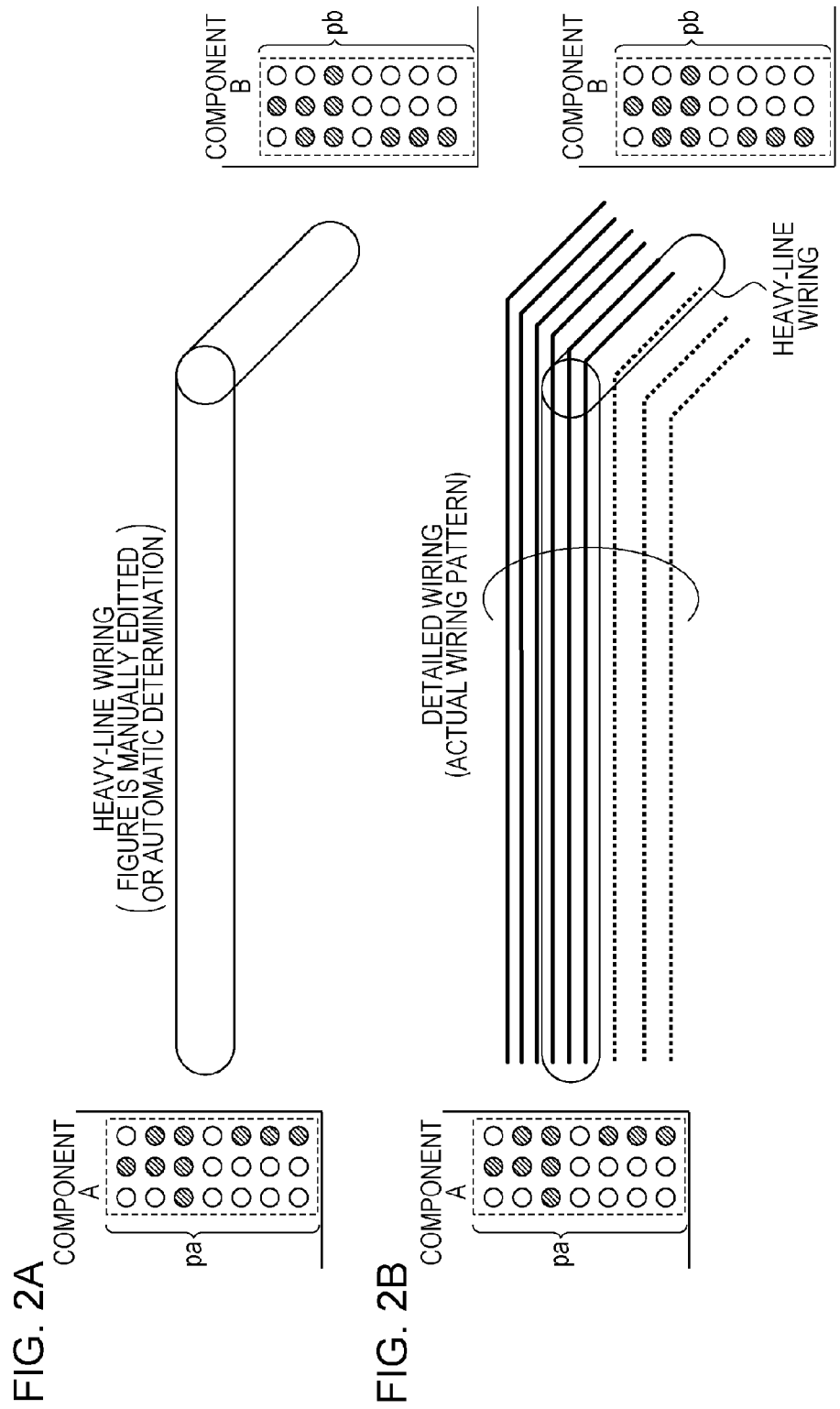
FIGS. 2A and 2B are diagrams for describing basic operation of the wiring-design support device according to the present embodiment.
Figure 3:
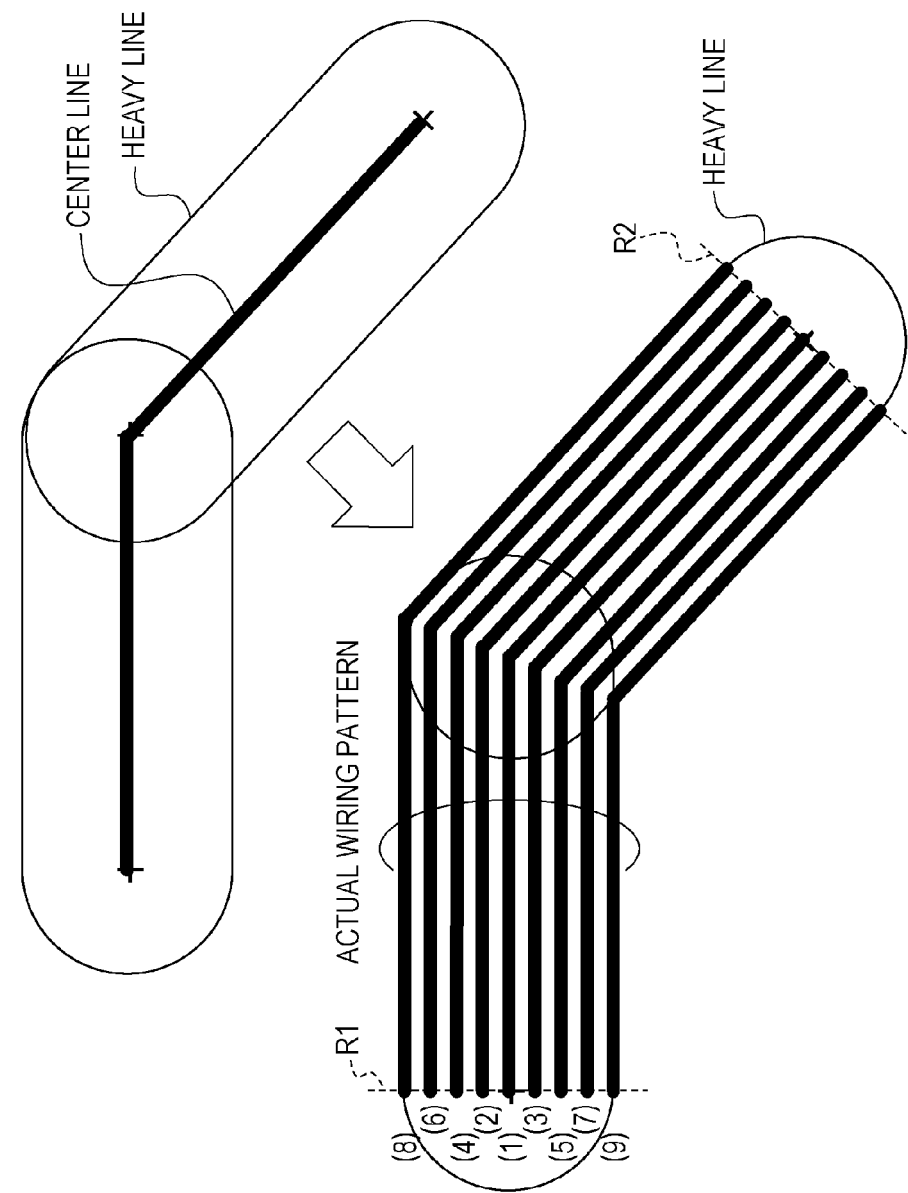
FIG. 3 is a diagram for describing a technique for generating actual wiring patterns from a heavy line.

The number of nets is the number of nets to be wired in parallel at each heavy line, e.g., 9 in FIGS. 2 and 3. The net numbers are identification information for identifying each net to be wired in parallel, e.g., in the event that the number of nets is 9 as with FIGS. 2 and 3, the identification information of nine types of nets is held as net numbers. However, the net numbers may not necessarily be held, and in the event that no net number is held, later-described simplified heavy-line wiring is executed. That is to say, in the event that the number of nets, the number of figures, and figure information numbers are held in a manner correlated with a heavy-line number, but the number of nets is not held, a heavy line corresponding to the heavy-line number thereof is a simplified heavy line (simplified wiring route; see FIG. 5).

The number of figures is the number of route figures forming a heavy line generated at a later-described heavy-line generating unit 11, e.g., 2 in FIGS. 2 and 3. The figure information numbers are identification information for identifying each route figure making up this heavy line, e.g., in the event that the number of figures is 2 as with FIGS. 2 and 3, the identification information of two kinds of route figures is held as figure information numbers.

Also, with the heavy-line data storage unit 21, as a wiring rule (wiring rule) to be used for performing later-described simplified heavy-line wiring, predetermined simplified line width and predetermined simplified gap are set and held. Multiple types of wiring rules for simplified heavy-line wiring may be set, and in such a case, identification information for identifying each wiring rule is appended, and each wiring rule is set and held in the heavy-line data storage unit 21 in a manner correlated with the identification information thereof.

With the net information storage unit 22, as net information regarding each net to be wired on a printed circuit board (wiring information), a wiring rule including line width and a gap rule is held in a manner correlated with a net number for identifying each net. A net number in the net information storage unit 22 is linked to a net number in the heavy-line data storage unit 21. The line width is the width of each net, i.e., signal wire, and the gap rule regulates the minimum gap at the time of wiring each net in parallel with the same type as with this net, or the minimum gap at the time of wiring each net in parallel with a different type of this net.

With the figure information storage unit 23, figure information (wiring information) regarding each route figure making up a heavy line generated at later-described heavy-line generating unit 11 is held in a manner correlated with a figure information number for identifying each route figure. A figure information number in the figure information storage unit 23 is linked to a figure information number in the heavy-line data storage unit 21. As figure information, the above-mentioned starting point/ending point coordinates and diameter (width) which are information for specifying the position and shape of each route figure are held, and also wiring layer information for identifying a wiring layer where a net corresponding to each route figure is wired is held in the event that a printed circuit board is formed of multiple layers.

Note that net information in the net information storage unit 22 is obtained before starting generation of a heavy line by the present device 1, and is set and saved beforehand. Also, the number of nets and net numbers for each heavy line in the heavy-line data storage unit 21 are set from the input unit 10 by the designer before starting generation of a heavy line by the present device 1. However, in the event of performing evaluation and study according to a simplified heavy line, only the number of nets of a heavy line to be studied is set from the input unit 10 by the designer.

Also, the number of figures and figure information numbers in the heavy-line data storage unit 21, and the figure information (starting point/ending point coordinates, diameter, and wiring layer information) correlated with the figure information numbers in the figure information storage unit 23 are set and held as heavy-line generation results by a later-described heavy-line generating unit 11. Though drawing is omitted in FIG. 1, information regarding actual wiring patterns (detailed wirings) generated by a later-described actual wiring pattern generating unit 12 is also held in the storage unit 20.

A heavy-line generating unit (wiring route generating unit) 11 generates, in prior to wiring processing in Section 1 and Section 3, a heavy line (wiring route) in Section 2 and displays on the display unit 40 based on wiring information held in the storage unit 20. Here, the wiring processing in Section 1 and Section 3 is processing for wiring a lead wire to be led out of the components A and B from the component terminals (pins) pa and pb of the two components A and B and to be connected to edge portions of multiple signal wires.

Upon a heavy line being generated by the wiring route generating unit 11, the actual wiring pattern generating unit (detailed wiring generating unit) 12 generates, based on the heavy line thereof and the wiring information (wiring rule) held in the storage unit 20, actual wiring patterns (detailed wirings) where each of the multiple signals is wired along the heavy line, and displays on the display unit 40 along with the heavy line.

2. Functions and Operations of Wiring-design Support Device According to Present Embodiment Next, description will specifically be made regarding various functions and operations that the wring-design support device 1 (heavy-line generating unit 11 and actual wiring pattern generating unit 12) according to the present embodiment configured as described above accomplishes, with reference to FIGS. 2A through 23.

2-1. Basic Operation (Operation Overview) of Wiring-Design Support Device

Basic operation of the wiring-design support device according to the present embodiment will be described with reference to FIGS. 2A and 2B.

With the wiring-design support device 1 according to the present embodiment, as illustrated in FIGS. 2A and 2B, in the event that multiple signal wires (nets) are wired in parallel between the components A and B, a wiring area is classified into three of Section 1, Section 2, and Section 3, and the following processing is executed. Note that Section 1 and Section 3 are areas where processing for leading out a net from the component pins pa and pb of the components A and B to the outside is performed, respectively. Also, Section 2 is an area between Section 1 and Section 3 where processing for generating actual wiring patterns is performed along with a heavy line.

With the present embodiment, as a technique for realizing wiring study/wiring capacitance study of bus signals obtained by bundling multiple signals in a printed circuit board accurately and also in short time, the processing is executed in the following sequence. Specifically, prior to wiring processing of Section 1 and Section 3, first, as illustrated in FIG. 2A, in Section 2, a wiring route where bus signals are represented as one heavy line is generated by the heavy-line generating unit 11 using automatic or manual figure editing and displayed on the display unit 40. Next, as illustrated in FIG. 2B, detailed wirings (actual wiring patterns) along with a heavy-line shape within the area of Section 2 are generated by the actual wring pattern generating unit 12, and displayed on the display unit 40 along with the heavy line. An actual wiring pattern generating technique will be described in detail in Item 2-2.

The designer performs wiring study/wiring capacitance study in Section 2 without taking Section 1 and Section 3 into consideration with reference to the heavy line and actual wiring patterns in Section 2 on the display unit 40 simultaneously. At this time, wiring processing of the heavy line and actual wiring patterns is performed at high speed while taking Section 2 alone into consideration without taking Section 1 and Section 3 into consideration, whereby wiring study/wiring capacitance study in Section 2 can be performed strictly at high-speed. As results of the study, the wiring processing results of the heavy line and actual wiring patterns are determined to be incompatible with the conditions, and upon change of the wiring state (position and so forth) of the heavy line being performed, in the same way as with the above, wiring study/wiring capacitance study in Section 2 is repeatedly performed at high speed, and accordingly, more strict study can be performed in short time.

As results of the study, in the event that the wiring processing results of the heavy line and actual wiring patterns are determined to be compatible with the condition, wiring processing in Section 1 and wiring processing in Section 3 are executed, bundle wiring from the component pins pa of the component A to the component pins pb of the component B is realized. With the wiring processing in Section 1, the component pin pa of the component A, and the component A side edge portions of the actual wiring patterns in Section 2 are connected, and with the wiring processing in Section 3, the component pin pb of the component B, and the component B side edge portions of the actual wiring patterns in Section 2 are connected. The wiring processes in Section 1 and Section 3 are executed automatically or manually using an conventional algorithm such as a linear search method or MAX-FLOW or the like.

2-2. Heavy-line and Actual Wiring Pattern Generating Technique

Next, description will be made regarding a function and a procedure for generating actual wiring patterns from a heavy line in accordance with the method (steps S11 through S15) illustrated in FIG. 4 with reference to FIG. 3.

With the holding unit 20 (net information storage unit 22), as described above, the line width and gap rule of each net are set and held as a wiring rule in a manner correlated with a net number.

The heavy-line generating unit 11 has a function for calculating, based on the line width and gap rule of each net belonging to a heavy line to be generated, the width of the heavy line, and also has a function for generating the heavy line having the calculated width using automatic or manual figure editing as illustrated in upper part of FIG. 3. At this time, the heavy-line generating unit 11 references each net number correlated with a heavy-line number of the heavy line to be generated in the heavy-line data storage unit 21, and reads out the line width and gap rule in the net information storage unit 22 linked to each referenced net number.

In particular, with the present embodiment, the heavy-line generating unit 11 calculates the minimum value of a net width in the event of disposing a net belonging to a heavy line in accordance with the gap rule of each net as the width of the heavy line. At this time, the heavy-line generating unit 11 calculates, based on the line width and gap rule of each net belonging to the heavy line, the minimum value of a bus signal wire width at the time of aligning nets using the same technique as a compact mode that will be described later with reference to FIG. 16B. Specifically, in the event that multiple types of nets to be wired with a different gap rule are mixed, the heavy-line generating unit 11 groups nets having the same type and aligns based on the gap rule, and also determines the alignment sequence of the nets so as to dispose a net having the greatest gap of the grouped net group, on the outermost side. The heavy-line generating unit 11 calculates the net width at the time of disposing a net belonging to the heavy line in the determined alignment sequence as the minimum width of the bus signal wire width, and obtains the calculated minimum width as the width of the heavy line to be generated.

In the event that a heavy line has been generated by the heavy-line generating unit 11, and multiple route figures (two route figures in upper part of FIG. 3) making up this heavy line has been obtained, the heavy-line generating unit 11 displays the heavy line made up of the multiple route figures on the display unit 40. Also, the heavy-line generating unit 11 holds the figure information of each route figure in the figure information storage unit 23 in a manner correlated with a figure information number for identifying each route figure.

In the event that heavy-line data has been generated using the function of the heavy-line generating unit 11 as described above (YES route in step S11), actual wiring patterns are generated from the heavy line by the function of the actual wiring pattern generating unit 12 as illustrated in Part B of FIG. 3. Note that, with the example illustrated in Part B of FIG. 3, let us say that all of the nine nets belonging to the heavy line have the same type. Also, a number illustrated with parentheses in the left edge in lower part of FIG. 3 indicates the wiring sequence of each net at the time of generating actual wiring patterns in the procedure illustrated in FIG. 4.

Figure 4:
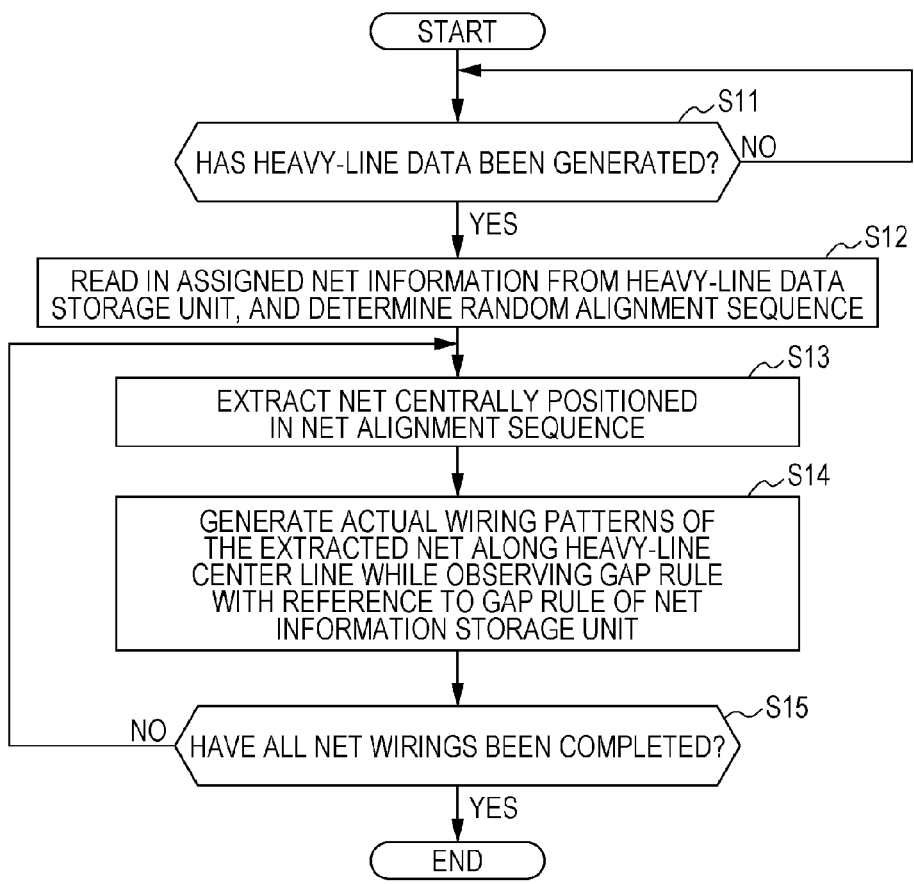
FIG. 4 is a method for describing a procedure for generating actual wiring patterns from a heavy line.

Here, the actual wiring pattern generating unit 12 has a function for generating actual wiring patterns (detailed wirings) as illustrated in lower part of FIG. 3 in accordance with steps S12 through S15 in FIG. 4 based on the line width and gap rule of each net belonging to the heavy line. At this time, the actual wiring pattern generating unit 12 reads in net information (net number) belonging to the heavy line to be processed from the heavy-data storage unit 21, and determines the alignment sequence of the nets at random (step S12).

Thereafter, the actual wiring pattern generating unit 12 extracts, of unwired nets belonging to the heavy line, one net positioned closest to the center in the alignment sequence determined in step S12 (step S13). At this time, in the event that the number of unwired nets is odd, the central net is extracted, and on the other hand, in the event that the number of unwired nets is even, one of the central two nets is extracted at random.

The actual wiring pattern generating unit 12 performs wiring of the extracted net along the center line of the heavy line illustrated in upper part of FIG. 3 in accordance with the gap rule of each net read out from the net information storage unit 22, and generates the actual wiring pattern of the extracted net and displayed on the display unit 40 (step S14). The processes in steps S13 and S14 are repeatedly executed (NO route in step S15) until these processes are executed on all of the nets belonging to the heavy line to be processed, i.e., until YES determination is made in step S15. The processes in steps S13 and S14 are repeatedly executed, and accordingly, as illustrated in lower part of FIG. 3, actual wiring patterns are generated along the heavy line.

At this time, an actual wiring pattern (1) to be first extracted is disposed on the center line of the heavy line illustrated in upper part of FIG. 3. Thereafter, with the example illustrated in lower part of FIG. 3, an actual wiring pattern (2) to be second extracted is disposed above the actual wiring pattern (1) in accordance with the gap rule, and an actual wiring pattern (3) to be third extracted is disposed below the actual wiring pattern (1) in accordance with the gap rule. Further, an actual wiring pattern (4) to be fourth extracted is disposed above the actual wiring pattern (2) in accordance with the gap rule, and an actual wiring pattern (5) to be fifth extracted is disposed below the actual wiring pattern (3) in accordance with the gap rule. The actual wiring patterns of the nine nets are generated by repeating the above procedure as illustrated in lower part of FIG. 3, and are displayed on the display unit 40 along with the heavy line simultaneously.

Note that, as illustrated in lower part of FIG. 3, both edges of an actual wiring pattern are cut at edge point positions R1 and R2 of both edges of the heavy line. The edge point positions R1 and R2 are the position of a straight line connecting the edge portions of two parallel straight lines connecting to a semicircle making up a route figure at the edge potions of the heavy line, and this straight line passes through the center of the semicircle.

Also, data regarding the actual wiring patterns generated by the actual wiring pattern generating unit 12 is stored in the storage unit 20.

As described above, with the wiring-design support device 1 according to the present embodiment, the heavy line in Section 2, and actual wiring patterns of nets belonging to this heavy line are generated at high speed and displayed on the display unit 40 simultaneously. Accordingly, the designer can strictly perform wiring study/wiring capacitance study in Section 2 without taking Section 1 and Section 3 into consideration.

2-3. Simplified Heavy Line and Actual Wiring Pattern Generating Technique

Next, description will be made regarding a function and a procedure for generating an actual wiring pattern from a simplified heavy line not depending on nets in accordance with the method illustrated in FIG. 6 (steps S21 through S24), with reference to FIG. 5.

With the present embodiment, as described above, with the heavy-line data storage unit 21, only the number of nets is set as information of nets belonging to a heavy line, and in the event that the net numbers are not set, the heavy-line generating unit 11 generates and displays a simplified heavy line (simplified wiring route) in accordance with the number of nets. Thus, the designer can perform wiring study/wiring capacitance study from a broader perspective (schematically) just by specifying the number of nets even in the event that signal wires included in a bundled line (bus signal wire) have not been determined in detail.

In the event that only the number of nets has been set as information of nets belonging to a heavy line in the heavy-line data storage unit 21, the heavy-line generating unit 11 has a function for calculating the width of a simplified heavy line based on the number of nets, and simplified line width and simplified gap held in the heavy-line data storage unit 21 beforehand. Also, the heavy-line generating unit 11 has a function for generating a simplified heavy line having the calculated width using automatic and manual figure editing as illustrated in upper part of FIG. 5. Here, for example, in the event that 20 is set as the number of nets, 0.130 mm is set as a simplified line width, and 0.1 mm is set as a simplified gap, the width of a simplified heavy line to be calculated by the heavy-line generating unit 11 becomes (0.130+0.1)×20−0.1=4.5 mm.

In the event that a simplified heavy line has been generated by the heavy-line generating unit 11, and a route figure making up this simplified heavy line (one route figure in upper part of FIG. 5) has been obtained, the heavy-line generating unit 11 displays the simplified heavy line making up the route figure on the display unit 40. Also, the heavy-line generating unit 11 holds the figure information of each route figure in the figure information storage unit 23 in a manner correlated with a figure information number for identifying each route figure.

Figure 5:
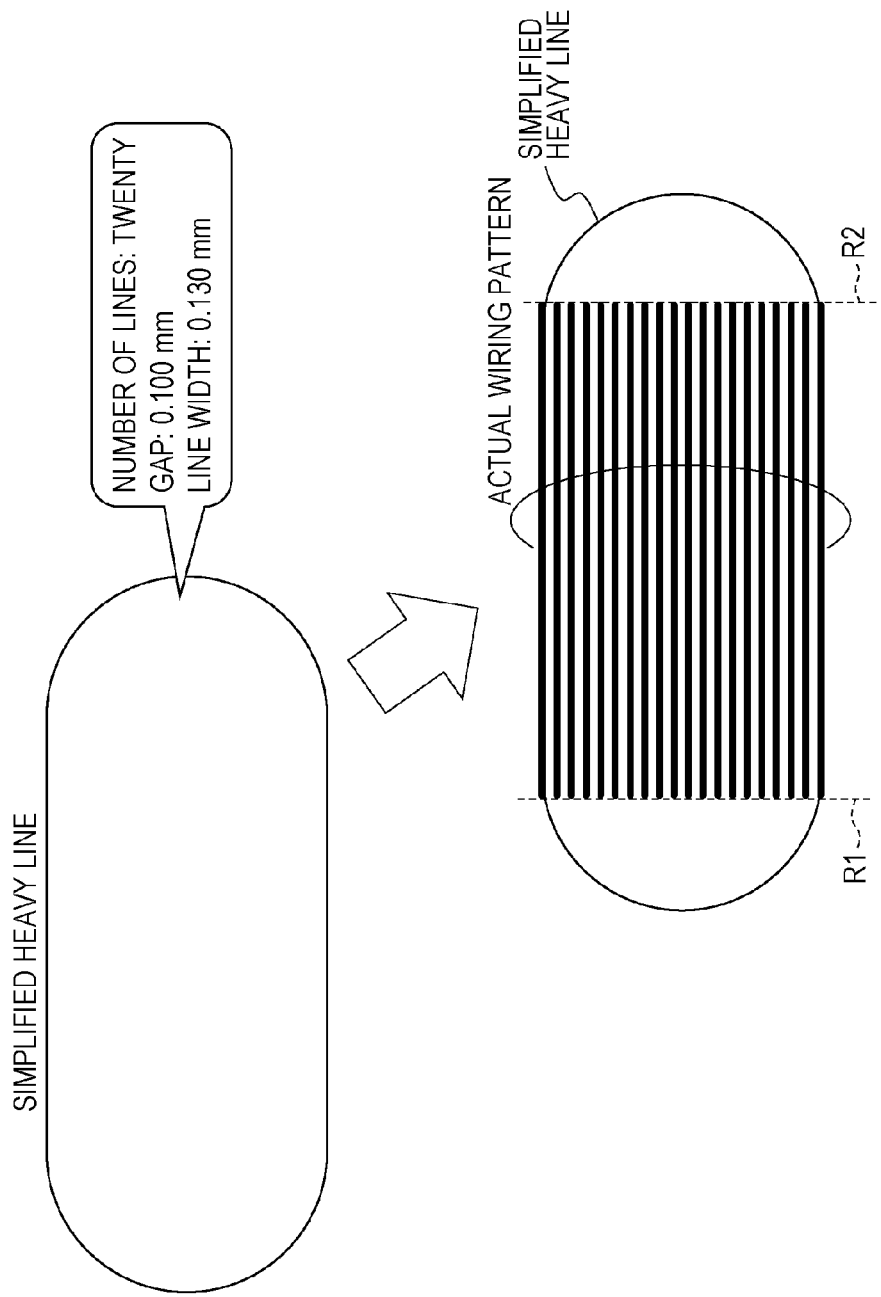
FIG. 5 is a diagram for describing a technique for generating actual wiring patterns from a simplified heavy line.

In the event that simplified heavy data has been generated using the function of the heavy-line generating unit 11 as described above (YES route in step S21), actual wiring patterns are generated from the simplified heavy line as illustrated in lower part of FIG. 5, by the function of the actual wiring pattern generating unit 12.

Figure 6:
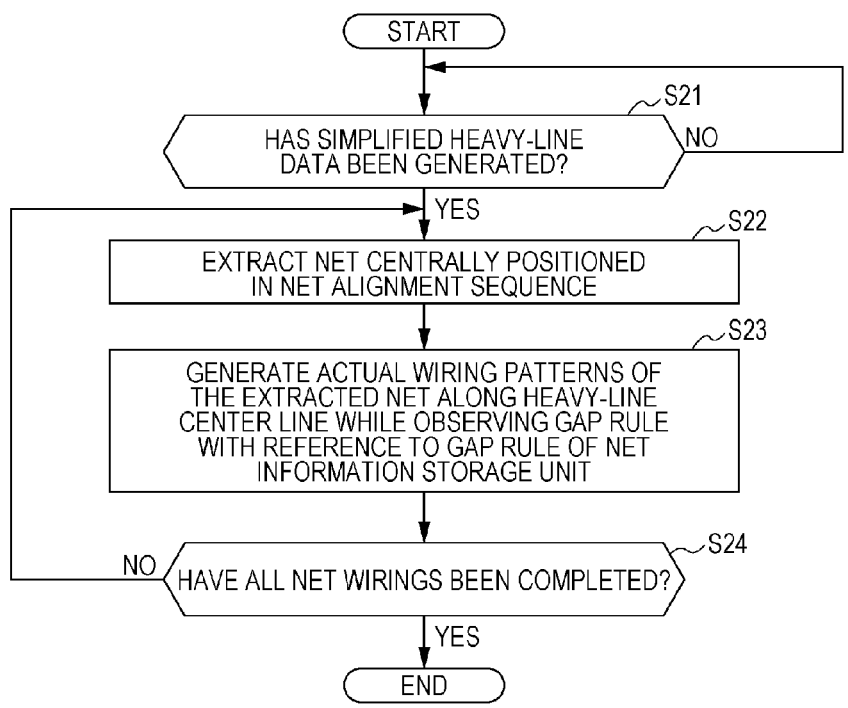
FIG. 6 is a method for describing a procedure for generating actual wiring patterns from a simplified heavy line.

Here, the actual wiring pattern generating unit 12 has a function for generating actual wiring patterns (detailed wirings) based on the simplified line width and simplified gap in accordance with steps S22 through S24 in FIG. 6, as illustrated in lower part of FIG. 5. Note that nets belonging to simplified heavy lines are all treated as the same type, and the alignment sequence of nets does not have to be considered, and accordingly, with the procedure illustrated in FIG. 6, processing equivalent to step S12 in FIG. 4 is omitted.

The actual wiring pattern generating unit 12 repeats the processes in steps S22 through S24, and accordingly, in the same way as the processes in steps S13 through S15 in FIG. 4, as illustrated in lower part of FIG. 5, the actual wiring patterns of 20 nets are sequentially generated from the central side of the simplified heavy line toward the outside along the simplified heavy line. The generated actual wiring patterns and simplified heavy line are displayed on the display unit 40 simultaneously.

Note that, as illustrated in lower part of FIG. 5, both edges of the actual wiring patterns are cut at the edge point positions R1 and R2 of both edges of the simplified heavy line. The edge point positions R1 and R2 are the position of a straight line connecting the edge portions of two parallel straight lines connecting to a semicircle making up a route figure at the edge potions of the simplified heavy line, and this straight line passes through the center of the semicircle.

Also, data regarding the actual wiring patterns generated by the actual wiring pattern generating unit 12 is stored in the storage unit 20.

As described above, with the wiring-design support device 1 according to the present embodiment, a simplified heavy line in Section 2 and actual wiring patterns of tentative nets belonging to this simplified heavy line are generated at high speed and displayed on the display unit 40 simultaneously just by the designer specifying the number of nets. Accordingly, wiring study/wiring capacitance study can be performed from the broader perspective (schematically) even in the event that signal wires included in a bundle line (bus signal wire) are not determined in detail.

2-4. Obstruction Detour Wiring Function (Heavy-Line Pasting Mode/Shape Quality Mode)

Next, description will be made regarding a procedure for generating actual wiring patterns from a heavy line in the event of the wiring-design support device 1 having a function for performing obstruction detour wiring in the heavy-line pasting mode/shape quality mode in accordance with the method (steps S31 through S38) illustrated in FIG. 8, with reference to FIGS. 7A through 7C. Note that FIGS. 7A through 7C are diagrams for describing the heavy-line pasting mode and shape quality mode of obstruction detour wiring.

With the example described with reference to upper part of FIG. 3 through FIG. 6, the actual wiring pattern generating unit 12 has performed generation and wiring of actual wiring patterns assuming that there is no obstruction (wiring prohibited area). However, now, let us say that in the event that there are obstructions as illustrated in FIG. 7A, the actual wiring pattern generating unit 12 generates actual wiring patterns, as illustrated in FIG. 7B, in the heavy-line pasting mode (high-density wiring mode) wherein a detour is made basically by wiring being perform in a manner pasting in an obstruction's conventional area and a heavy line as much as possible. In the event that wiring is performed in such a heavy-line pasting mode, actual wiring patterns can be wired with high density. However, as can be apparent with reference to FIG. 7B, in the event that wiring is performed in the heavy-line pasting mode, the outer actual wiring patterns make a greater detour than the central actual wiring patterns, and accordingly, line lengths differ depending on nets, which leads to a timing problem.

Therefore, with the wiring-design support device 1 according to the present embodiment, the designer can select the quality preferential mode (shape quality mode) through the input unit 30. In the event that the shape quality mode has been selected, the actual wiring pattern generating unit 12 has a function for correcting a detour actual wiring pattern generated in the heavy-line pasting mode as illustrated in FIG. 7B so as to have the same length as an actual wiring pattern which makes no detour as illustrated in FIG. 7C.

Hereafter, description will be made regarding a procedure for generating an actual wiring pattern from a heavy line by the wiring-design support device 1 having an obstruction detour wiring function as described above, in accordance with FIG. 8. Note that processes in steps S31 through S35 in FIG. 8 are basically the same as the processes in steps S11 through S15 in FIG. 4, and accordingly, detailed description thereof will be omitted. However, with the processing in step S34, in the event that there is an area including an obstruction or a wiring prohibited area as illustrated in FIG. 7A, actual wiring patterns are generated in the heavy-line pasting mode as illustrated in FIG. 7B.

After generating actual wiring patterns in the heavy-line pasting mode, the actual wiring pattern generating unit 12 determines whether or not the shape quality mode has been selected (step S36). In the event that the shape quality mode has been selected (YES route in step S36), the actual wiring pattern generating unit 12 determines whether or not there is a detour actual wiring pattern generated in the heavy-line pasting mode, as illustrated in FIG. 7B (step S37). In the event that there is a detour actual wiring pattern (YES route in step S37), the actual wiring pattern generating unit 12 corrects the detour actual wiring pattern so as to have the same length as an actual wiring pattern which makes no detour as illustrated in FIG. 7C (step S38). The actual wiring pattern generating unit 12 then displays the actual wiring pattern after correction on the display unit 40 along with the heavy line.

On the other hand, in the event that the shape quality mode has not been selected (NO route in step S36), or in the event that there is no detour actual wiring pattern (NO route in step S37), the actual wiring pattern generating unit 12 ends the processing.

Thus, the designer can generate actual wiring patterns having an equal length that causes no timing problem by selecting the shape quality mode, and in the event of selecting no shape quality mode, a high-density actual wiring pattern can be generated. According to such a function being employed, the designer can perform wiring according to conditions by selecting the heavy-line pasting mode in the event of prioritizing high-density wiring over timing precision, or selecting the shape quality mode in the event of placing priority on timing precision.

2-5. Heavy-line Editing Interlocking Function

Next, description will be made regarding a procedure for regenerating actual wiring patterns in conjunction with change in the heavy-line route, in accordance with the method illustrated in FIG. 10 (steps S41 through S47) with reference to left part through right part of FIG. 9.

With the present embodiment, in a state in which heavy-line data and actual wiring patterns are displayed on the display unit 40, the designer gives instructions to the heavy-line generating unit 11 through the input unit 30, whereby change in the heavy-line route can be performed using the heavy-line generating unit 11 (editing of the heavy line route figure). The heavy-line generating unit 11 has a function for editing the route figure of the heavy line according to editing instructions input from the input unit 30 by the designer. The actual wiring pattern generating unit 12 has a function for regenerating actual wiring patterns based on the heavy line after editing by the heavy-line generating unit 11, and the above wiring rule in the storage unit 20 to display on the display unit 40 along with the heavy line after editing (heavy-line editing interlocking function).

Figure 8:
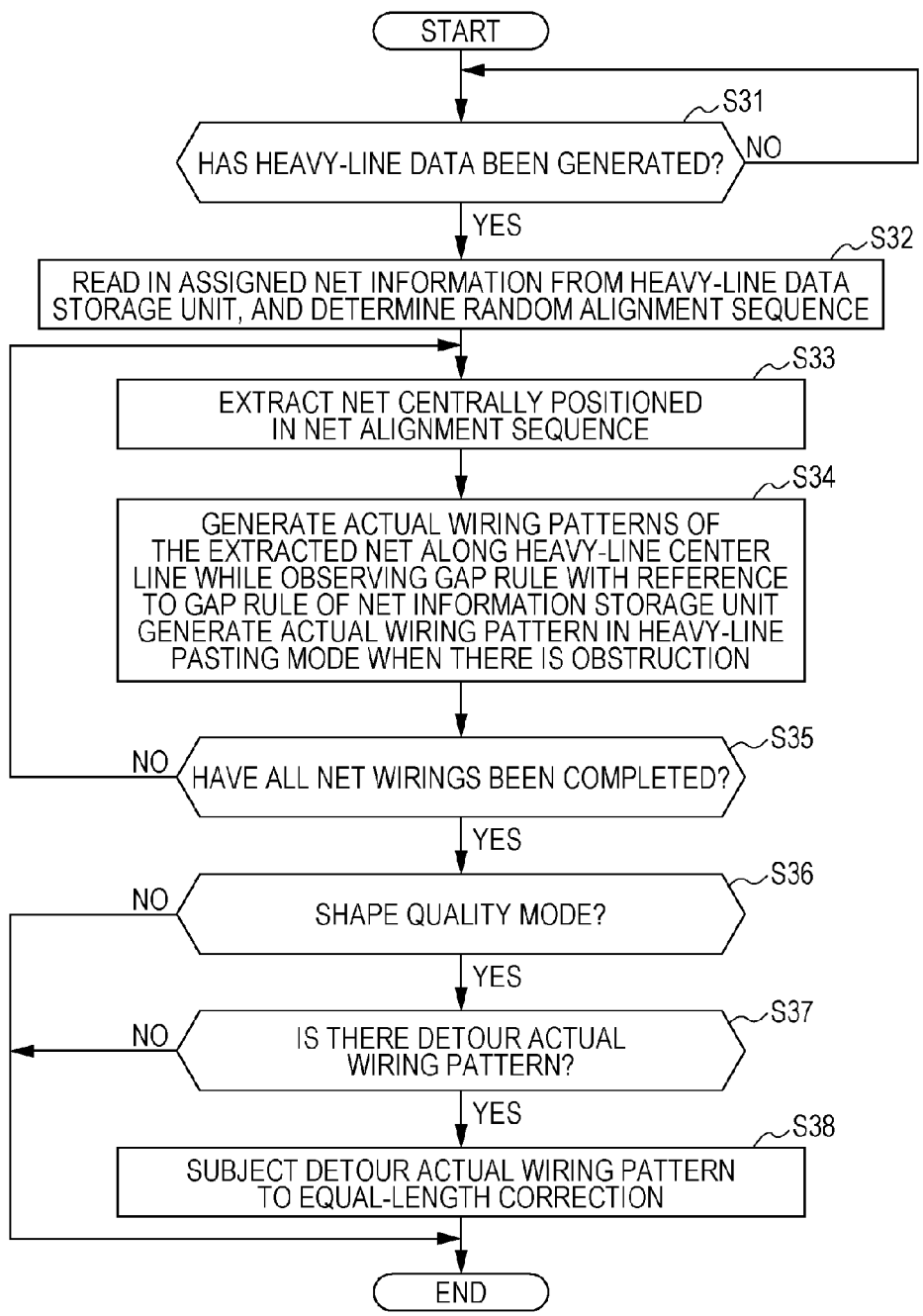
FIG. 8 is a method for describing a procedure for generating actual wiring patterns from a heavy line in the event of having a function for performing obstruction detour wiring in the heavy-line pasting mode or shape quality mode.
Figure 9:
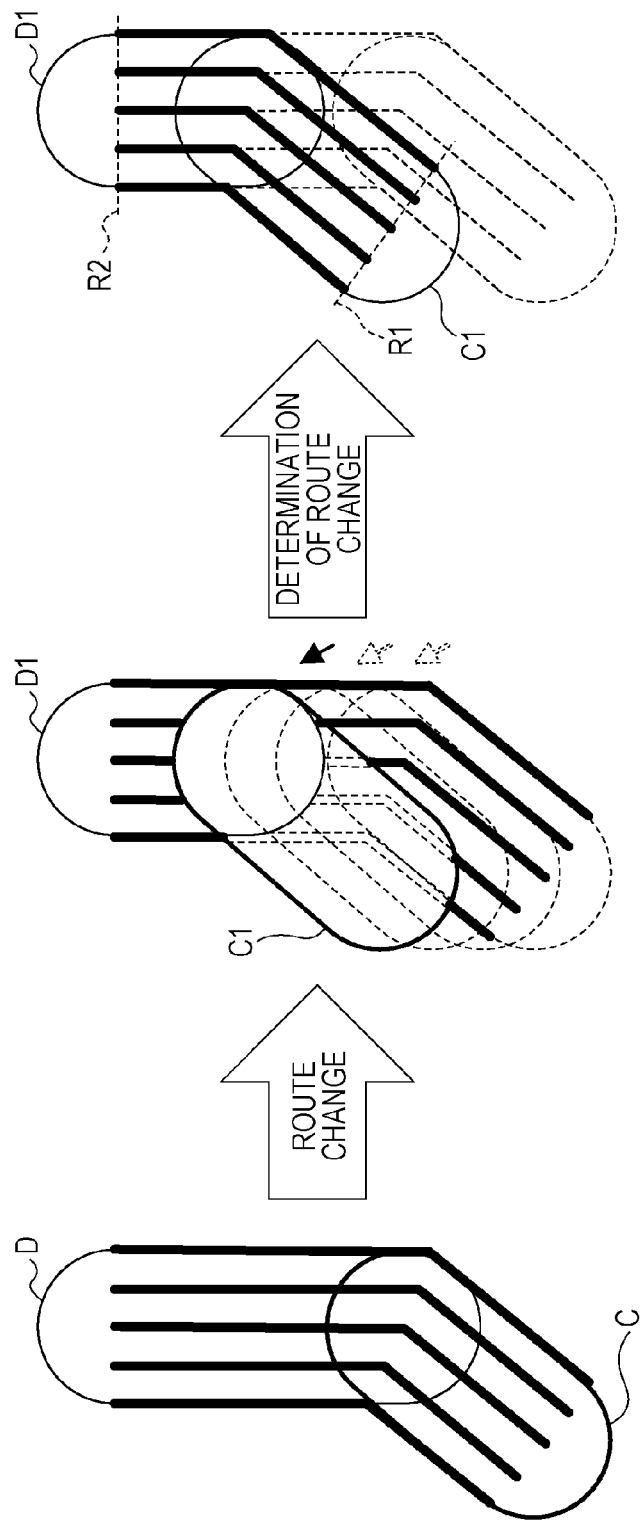
FIG. 9 is a diagram for describing a technique for regenerating actual wiring patterns in conjunction with change in a heavy-line route.

Now, for example, as illustrated in left part of FIG. 9, let us say that a heavy line made up of two route figures C and D has been generated, actual wiring patterns have been generated in the procedure illustrated in FIG. 4 or 8, and the heavy line and the actual wiring patterns are displayed on the display unit 40 (YES route in step S41). Description will be made regarding operation of the present device 1 wherein in such a state, in the event that the designer has performed route change of the heavy line through the input unit 30 as illustrated in middle part B of FIG. 9 (step S42).

For example, as illustrated in middle part of FIG. 9, let us say that the designer has executed editing for moving the route figure C of the heavy line illustrated in left part of FIG. 9 upward in the drawing. At this time, the actual wiring patterns generated as to the heavy line before editing are deleted, and also accompanied with movement of the route figure C, the route figure D connected to the route figure C is reduced and deformed by the movement amount of the route figure C. In middle part of FIG. 9, route figures after editing the route figures C and D are illustrated with reference numerals C1 and D1, respectively. Upon determination instructions being input from the input unit 30 by the designer, the heavy line after editing is determined to be a heavy line illustrated in right part of FIG. 9 (step S42). Accompanied therewith, the heavy-line generating unit 11 generates figure information of the route figures C1 and D1 making up the heavy line after editing, and rewrites the figure information of the route figures C and D in the figure information storage unit 23 with those of the route figures C1 and D1 (step S43).

Figure 10:
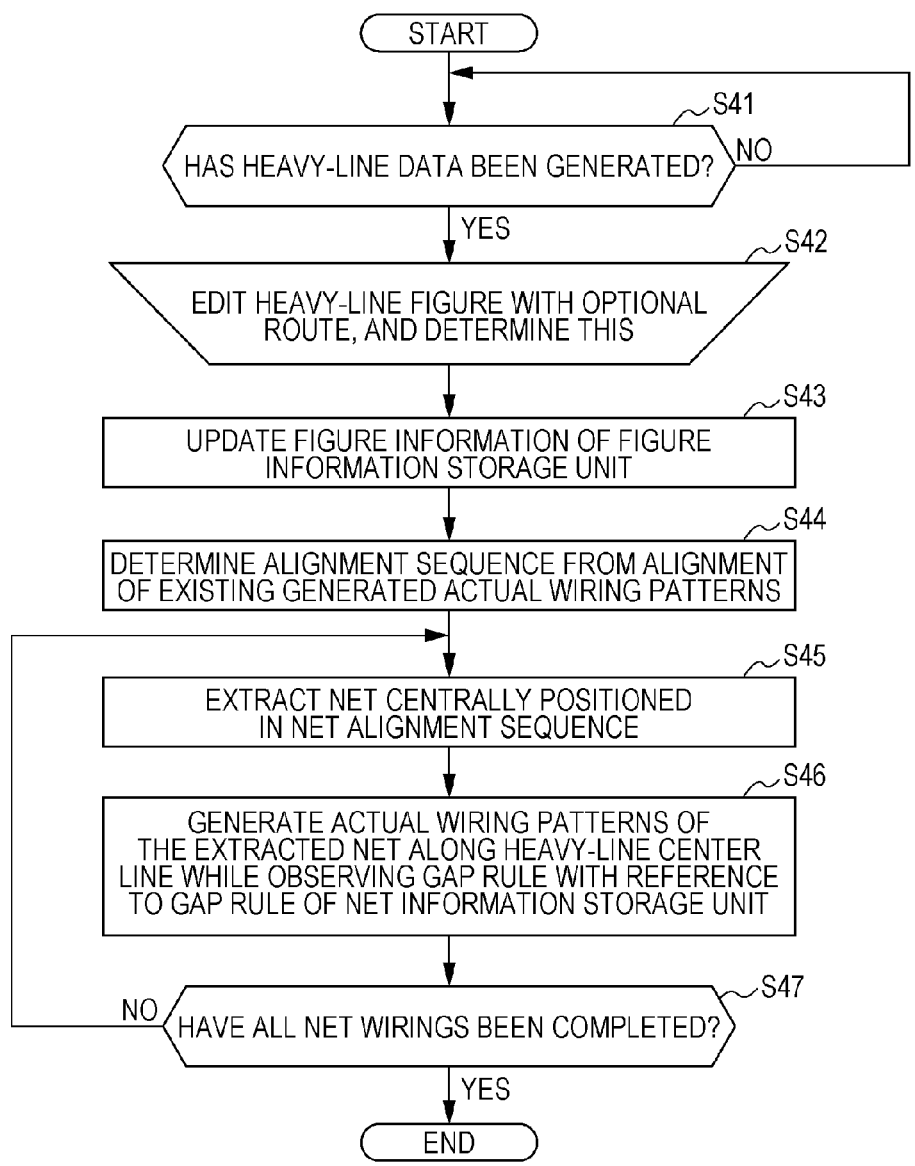
FIG. 10 is a method for describing a procedure for regenerating actual wiring patterns in conjunction with change in a heavy-line route.

As described above, upon heavy-line data after editing being generated using the function of the heavy-line generating unit 11, the actual wiring pattern generating unit 12 regenerates actual wiring patterns from the heavy line after editing, as illustrated in right part of FIG. 9, in accordance with steps S44 through S47 in FIG. 10. At this time, the actual wiring pattern generating unit 12 determines the alignment sequence of nets belonging to the heavy line after editing based on the alignment of already generated actual wiring patterns of nets belonging to the heavy line before editing (step S44). For example, the actual wiring pattern generating unit 12 determines the alignment sequence of nets belonging to the heavy line after editing to be the alignment sequence of the already generated actual wiring patterns.

Thereafter, the actual wiring pattern generating unit 12 repeats the processes in steps S45 through S47, and accordingly, in the same way as the processes in steps S13 through S15 in FIG. 4, as illustrated in middle part of FIG. 9, the actual wiring patterns of five nets are sequentially generated from the center side of the heavy line after editing toward the outer side along the heavy line after editing. The generated actual wiring patterns and heavy line after editing are then displayed on the display unit 40 simultaneously.

Note that, as illustrated in right part of FIG. 9, both edges of the actual wiring patterns are cut at the edge point positions R1 and R2 of both edges of the heavy line after editing. The edge point positions R1 and R2 are the position of a straight line connecting the edge portions of two parallel straight lines connecting to a semicircle making up a route figure at the edge portions of the heavy line, and this straight line passes through the center of the semicircle.

Also, data regarding the actual wiring patterns generated by the actual wiring pattern generating unit 12 is stored in the storage unit 20.

As described above, with the wiring-design support device 1 according to the present embodiment, in the event that an actual wiring pattern has already been generated at the time of editing the route of a heavy line, the actual wiring pattern generated along the heavy line before editing is deleted, and a new actual wring pattern is generated along a new heavy line. That is to say, an actual wiring pattern in Section 2 is changed in conjunction with or following editing of the heavy line, and displayed on the display unit 40 along with the heavy line after editing. Accordingly, the designer is allowed to repeatedly perform wiring study/wiring capacitance study in Section 2 at high speed while performing editing of the heavy line, and allowed to perform more strict study.

2-6. Coupling Technique between Heavy Line and Simplified Heavy Line

With the wiring-design support device 1 according to the present embodiment, in the event that a heavy line and a simplified heavy line have been coupled, actual wiring patterns are regenerated based on the net information that the heavy line has using the following function.

With the present embodiment, in a state in which a heavy line and actual wiring patterns along this heavy line, and a simplified heavy line and actual wiring patterns along this simplified heavy line are displayed on the display unit 40, the designer can couple the heavy line and simplified heavy line using the heavy-line generating unit 11 by giving instructions to the heavy-line generating unit 11 through the input unit 30.

In response to the coupling instructions input from the input unit 30 by the designer, the heavy-line generating unit 11 changes the simplified heavy line in a state conforming to the heavy line to display on the display unit 40, and also generates a coupling heavy line (coupling wiring route) conforming to the heavy line which couples the heavy line after change and the heavy line to display on the display unit 40. The actual wiring pattern generating unit 12 generates a coupling heavy line, and actual wiring patterns along the heavy line after change based on the coupling heavy line and the heavy line after change and the wiring rule to display on the display unit 40 along with the coupling heavy line and the heavy line after change. That is to say, the simplified heavy line is, upon being coupled with the conventional heavy line via the coupling heavy line, changed to a heavy line in accordance with the same wiring rule as with the conventional heavy line.

Hereafter, description will be made specifically regarding a coupling method between a heavy line and a simplified heavy line with reference to Part A and B of FIG. 11.

Figure 11:
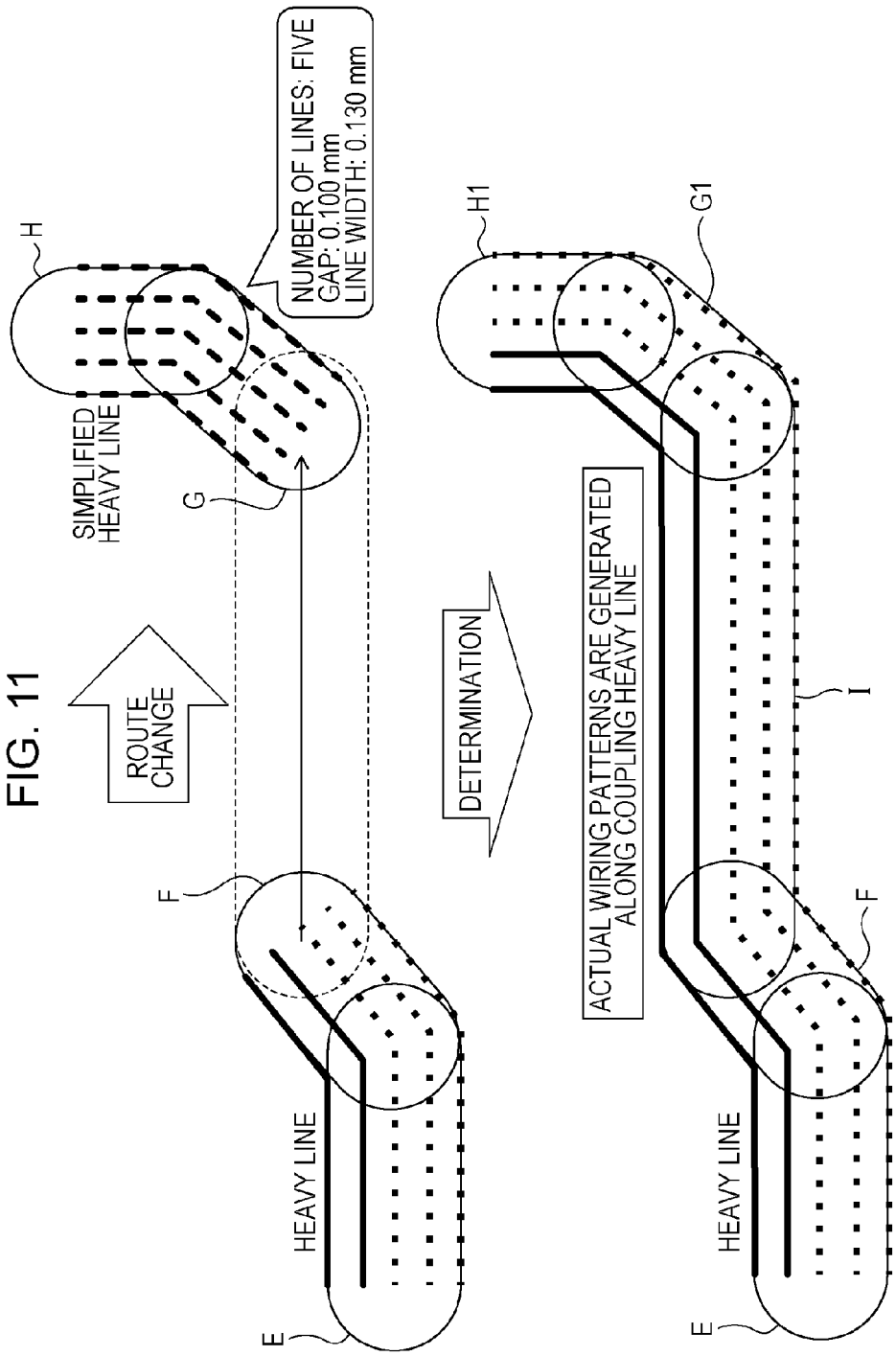
FIG. 11 is a diagram for describing a coupling technique between a heavy line and a simplified heavy line.

With the example illustrated in upper part of FIG. 11, a heavy line made up of two route figures E and F, and five actual wiring patterns along this heavy line are generated and displayed. Of the five actual wiring patterns, two lines on the upper side (see actual wiring patterns) are wired in parallel in accordance with a first wiring rule (line width, gap), and of the five actual wiring patterns, three lines on the lower side (see dotted line patterns) are wired in parallel in accordance with a second wiring rule different from the first wiring rule.

Also, with the example illustrated in Part A of FIG. 11, a simplified heavy line made up of two route figures G and H, and five actual wiring patterns along this simplified heavy line are generated and displayed. For the simplified heavy line illustrated in Part A of FIG. 11, 5 is set as the number of nets, 0.130 mm is set as the simplified line width, and 0.1 mm is set as the simplified gap. At this time, the width of the simplified heavy line calculated by the heavy-line generating unit 11 is $(0.130+0.1) \times 5-0.1=1.05$ mm.

Let us say that, in a state in which a heavy line and a simplified heavy line are displayed as described above, the designer has input coupling instructions for coupling the upper right edge of the route figure F of the heavy line and the lower left edge of the route figure G of the simplified heavy line from the input unit 30. At this time, the heavy-line generating unit 11 changes, as illustrated in middle part of FIG. 11, the route figures G and H of the simplified heavy line to route figures G1 and H1 having the same width (radius) as with the route figures E and F of the heavy line to display on the display unit 40. Also, the heavy-line generating unit 11 generates, as illustrated in Part B of FIG. 11, a route figure I serving as a coupling heavy line for coupling the upper right edge of the route figure F of the heavy line and the lower left edge of the route figure G1 of the heavy line after change to display on the display unit 40. The route figure I making up the coupling heavy line has the same width (radius) as with the route figures E and F of the heavy line.

In the event that a series of heavy lines made up of the route figures E, F, I, G1, and H1 have been generated, the actual wiring pattern generating unit 12 generates actual wiring patterns as follows. Specifically, the actual wiring pattern generating unit 12 generates, as illustrated in Part B of FIG. 11, actual wiring patterns along the heavy line made up of the route figures I, G1, and H1 in accordance with the wiring rule of the heavy line made up of the route figures E and F to display on the display unit 40 along with this heavy line. At this time, five actual wiring patterns along the heavy line made up of the route figures I, G1, and H1 are connected to the five already generated actual wiring patterns along the route figure F at a connection portion between the route figures F and I, respectively.

In the event that the heavy line and the simplified heavy line have been coupled as described above, the heavy-line generating unit 11 integrates the data of the simplified heavy line with the data of the heavy line along with the data of a newly added coupling heavy line at the heavy-line data storage unit 21, and deletes the data of the simplified heavy line. Also, data regarding the actual wiring patterns generated by the actual wiring pattern generating unit 12 is held in the storage unit 20.

With the wiring-design support device 1 according to the present embodiment, as illustrated in upper part of FIG. 11, Section 2 is optionally segmentalized, a heavy line or simplified heavy line and actual wiring patterns are generated and displayed for each segmentalized portion, and the designer can perform wiring study/wiring capacitance study with reference to the display thereof. After performing wiring study/wiring capacitance study for each portion, according to coupling instructions of the designer, the heavy line and simplified heavy line are coupled via a coupling heavy line as appropriate, and actual wiring patterns along a series of heavy lines after coupling are generated and displayed, and accordingly, the designer's convenience can be improved.

Note that, basically, a heavy line and a simplified heavy line are coupled with it as a condition that the number of nets belonging to the heavy line is the same as the number of nets belonging to the simplified heavy line. However, in the event that the number of nets belonging to the heavy line differs from the number of nets belonging to the simplified heavy line, the actual wiring pattern generating unit 12 may change the number of nets belonging to the simplified heavy line to the number of nets belonging to the heavy line, and then generate actual wiring patterns in accordance with the wiring rule of the heavy line.

2-7. Coupling Technique between Simplified Heavy Line and Simplified Heavy Line

With the wiring-design support device 1 according to the present embodiment, in the event of having coupled a simplified heavy line and a simplified heavy line, actual wiring patterns are regenerated based on net information that the simplified heavy lines have using the following function.

With the present embodiment, in a state in which a first simplified heavy line and actual wiring patterns along this first simplified heavy line, and a second simplified heavy line and actual wiring patterns along this second simplified heavy line are displayed on the display unit 40, the designer gives instructions through the input unit 30, thereby enabling the first simplified heavy line and second simplified heavy line to be coupled by the heavy-line generating unit 11.

The heavy-line generating unit 11 changes, in response to coupling instructions input from the input unit 30 by the designer, the second simplified heavy line to a state conforming to the first simplified heavy line to display on the display unit 40. Also, the heavy-line generating unit 11 generates a coupling simplified heavy line (coupling simplified wiring route) conforming to the first simplified heavy line which couples the first simplified heavy line and the second simplified heavy line after change to display on the display unit 40. The actual wiring pattern generating unit 12 generates actual wiring patterns along the coupling simplified heavy line and the second simplified heavy line after change based on the coupling simplified heavy line and the second simplified heavy line after change and the wiring rule to display on the display unit 40 along with the coupling simplified heavy line and the second simplified heavy line after change. That is to say, in the event that the second simplified heavy line has been coupled with the first simplified heavy line via the coupling simplified heavy line, the second simplified heavy line is changed to a simplified heavy line conforming to the same wiring rule as with the first simplified heavy line. With the present embodiment, of two simplified heavy lines to be coupled, a simplified heavy line having a greater simplified line width and simplified gap is taken as the first simplified heavy line.

Hereafter, description will be made more specifically regarding a coupling technique between a first simplified heavy line and a second simplified heavy line, with reference to FIG. 12.

With the example illustrated in upper part of FIG. 12, a first simplified heavy line made up of two route figures J and K and five actual wiring patterns along this first simplified heavy line are generated and displayed. For the first simplified heavy line, 5 is set as the number of nets, 0.150 mm is set as the simplified line width, and 0.130 mm is set as the simplified gap. At this time, the width of the first simplified heavy line calculated by the heavy-line generating unit 11 is $(0.150+0.130) \times 5-0.130=1.27$ mm.

Also, with the example illustrated in upper part of FIG. 12, a second simplified heavy line made up of two route figures L and M and five actual wiring patterns along this second simplified heavy line are generated and displayed. For the second simplified heavy line, 5 is set as the number of nets, 0.100 mm is set as the simplified line width, and 0.100 mm is set as the simplified gap. At this time, the width of the second simplified heavy line calculated by the heavy-line generating unit 11 is (0.100+0.100)×5−0.100=0.90 mm.

Let us say that, in a state in which a first simplified heavy line and a second simplified heavy line are displayed as described above, the designer has input coupling instructions for coupling the upper right edge of the route figure K of the first simplified heavy line and the lower left edge of the route figure L of the second simplified heavy line from the input unit 30. At this time, the heavy-line generating unit 11 changes, as illustrated in lower part of FIG. 12, the route figures L and M of the second simplified heavy line to route figures L1 and M1 having the same width (radius) as with the route figures J and K of the first simplified heavy line to display on the display unit 40. Also, the heavy-line generating unit 11 generates, as illustrated in lower part of FIG. 12, a route figure N serving as a coupling simplified heavy line for coupling the upper right edge of the route figure K of the first simplified heavy line and the lower left edge of the route figure L1 of the second simplified heavy line after change to display on the display unit 40. The route figure N making up the coupling simplified heavy line has the same width (radius) as with the route figures J and K of the first simplified heavy line.

In the event that a series of simplified heavy lines made up of the route figures J, K, N, L1, and M1 have been generated, the actual wiring pattern generating unit 12 generates actual wiring patterns as follows. Specifically, the actual wiring pattern generating unit 12 generates, as illustrated in lower part of FIG. 12, actual wiring patterns along the simplified heavy line made up of the route figures N, L1, and M1 in accordance with the wiring rule of the first simplified heavy line made up of the route figures J and K to display on the display unit 40 along with this simplified heavy line. At this time, five actual wiring patterns along the heavy line made up of the route figures N, L1, and M1 are connected to the five already generated actual wiring patterns along the route figure K at a connection portion between the route figures K and N, respectively.

In the event that the first simplified heavy line and the second simplified heavy line have been coupled as described above, the heavy-line generating unit 11 integrates the data of the second simplified heavy line with the data of the first simplified heavy line along with the data of a newly added coupling simplified heavy line at the heavy-line data storage unit 21, and deletes the data of the second simplified heavy line. Also, data regarding the actual wiring patterns generated by the actual wiring pattern generating unit 12 is held in the storage unit 20.

With the wiring-design support device 1 according to the present embodiment, as illustrated in upper part of FIG. 12, Section 2 is optionally segmentalized, a simplified heavy line is generated and displayed for each segmentalized portion, and the designer can perform wiring study/wiring capacitance study with reference to the display thereof. After performing wiring study/wiring capacitance study for each portion, according to coupling instructions of the designer, the first simplified heavy line and second simplified heavy line are coupled via a coupling simplified heavy line as appropriate, and actual wiring patterns along a series of simplified heavy lines after coupling are generated and displayed, and accordingly, the designer's convenience can be improved.

Note that, basically, a first simplified heavy line and a second simplified heavy line are coupled with it as a condition that the number of nets belonging to the first simplified heavy line is the same as the number of nets belonging to the second simplified heavy line. However, in the event that the number of nets belonging to the first simplified heavy line differs from the number of nets belonging to the second simplified heavy line, the actual wiring pattern generating unit 12 may change the number of nets belonging to the second simplified heavy line to the number of nets belonging to the first simplified heavy line, and then generate actual wiring patterns in accordance with the wiring rule of the first simplified heavy line.

Also, with the present embodiment, as described above, of two simplified heavy lines to be integrated, a simplified heavy line having greater simplified line width and simplified gap is taken as the first simplified heavy line, change of the second simplified heavy line and addition of a coupling simplified heavy line are performed so as to agree with the first simplified heavy line. Conversely, of the two simplified heavy lines to be coupled, a simplified heavy line having smaller simplified line width and simplified gap may be taken as the first simplified heavy line. Also, an arrangement may be made wherein the designer is allowed to select which the simplified line width and simplified gap of the first simplified heavy line and the second simplified heavy line are used for coupling processing.

2-8. Transfer to Another Wiring Layer

With the figure information storage unit 23, wiring layer information for identifying a wiring layer where a net corresponding to each route figure is wired is held as figure information of each route figure making up a heavy line, but with the above example, assumption is made wherein one heavy line is basically wired in the same wiring layer and is not transferred to another wiring layer. In the event that the processing speed is fast, and a timing condition is strict, it is desirable that the number of wiring layers where a net has to be wired is restricted to one layer. However, in the event that a timing condition is not strict, there is no problem even when a net belonging to one heavy line transfers to another wiring layer in the middle of the processing.

With the present embodiment, wiring layer information is set for each route figure in the figure information storage unit 23, and accordingly, information regarding a wiring layer where each route figure has to be wired is specified. That is to say, in the event that wiring layers set to two route figures to be coupled differ, it can be confirmed that a net is transferred to another wiring layer at a coupled portion of the two route figures.

Now, description will be made more specifically regarding a technique for generating actual wiring patterns where transfer to another wiring layer is performed, from a heavy line, with reference to FIGS. 13A and 13B.

Figure 13A:
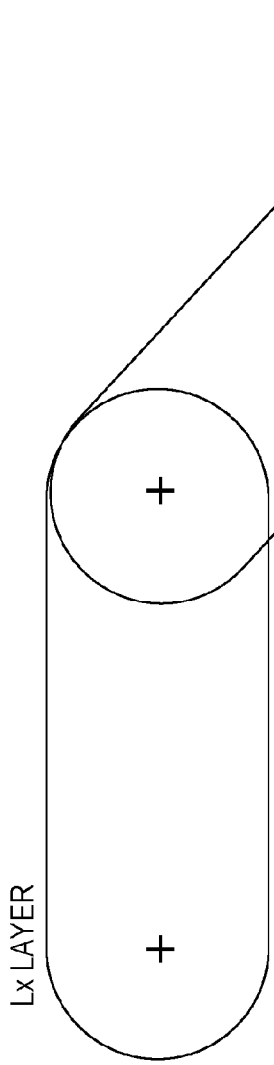
FIGS. 13A and 13B are diagrams for describing a technique for generating actual wiring patterns of which the wiring layer is to be changed, from a heavy line.

With the example illustrated in FIG. 13A, two route figures belong to a heavy line generated by the heavy-line generating unit 11, an Lx layer and an Ly layer which are different wiring layers are set to the two route figures as wiring layer information, respectively. In this case, actual wiring patterns corresponding to one of the route figures are wired on the Lx layer, and actual wiring patterns corresponding to the other route figure are wired on the Ly layer.

Figure 13B:
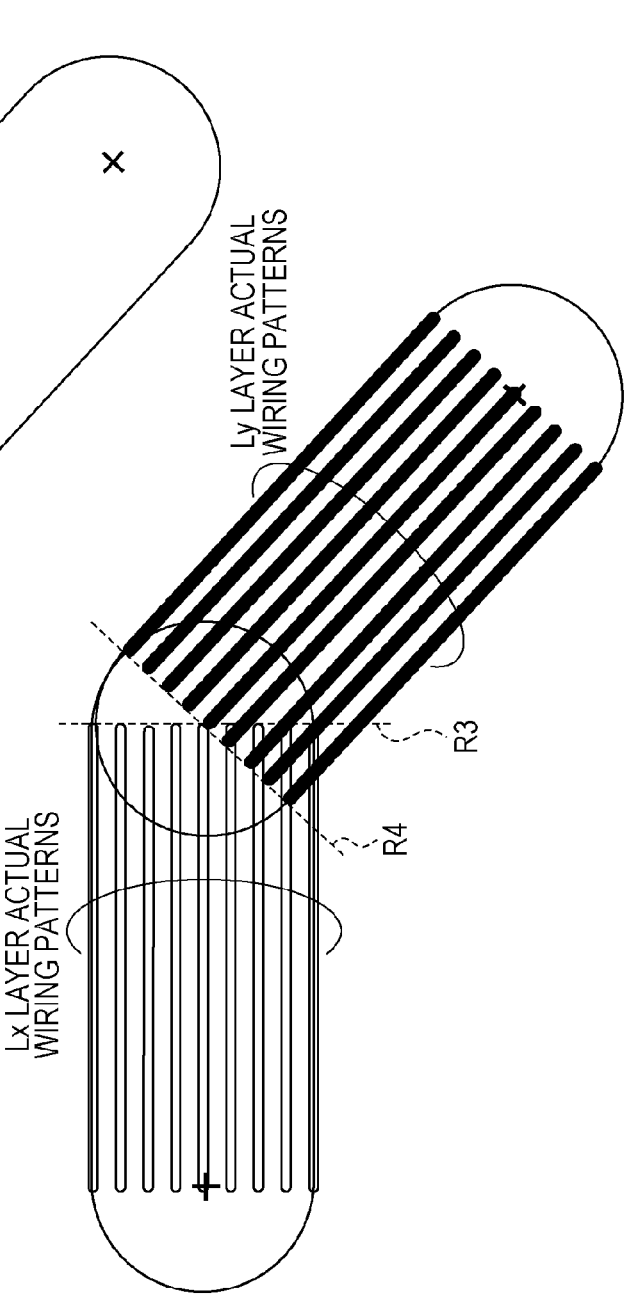

The wiring layer pattern generating unit 12 generates, as illustrated in FIG. 13B, actual wiring patterns for each wiring layer based on wiring layer information set to each route figure to display on the display unit 40. At this time, actual wiring patterns in each route figure are displayed for each wiring layer with at least one of the display line type of the actual wiring patterns and the display color of the actual wiring patterns being changed. Thus, the designer can immediately visually confirm which wiring layer the actual wiring patterns are wired on.

Note that, with the example illustrated in FIG. 13B, at a portion where the wiring layer of a net changes (coupled portion of two route figures), the edge portions of the actual wiring patterns on the Lx layer are cut at an edge point position R3 of one of the route figures, and the edge portions of the actual wiring patterns on the Ly layer are cut at an edge point position R4 of the other route figure. The edge point positions R3 and R4 are the position of a straight line connecting the edge portions of two parallel straight lines which are connected to a semicircle making up each route figure, and this straight line passes through the center of the semicircle.

Figure 14:
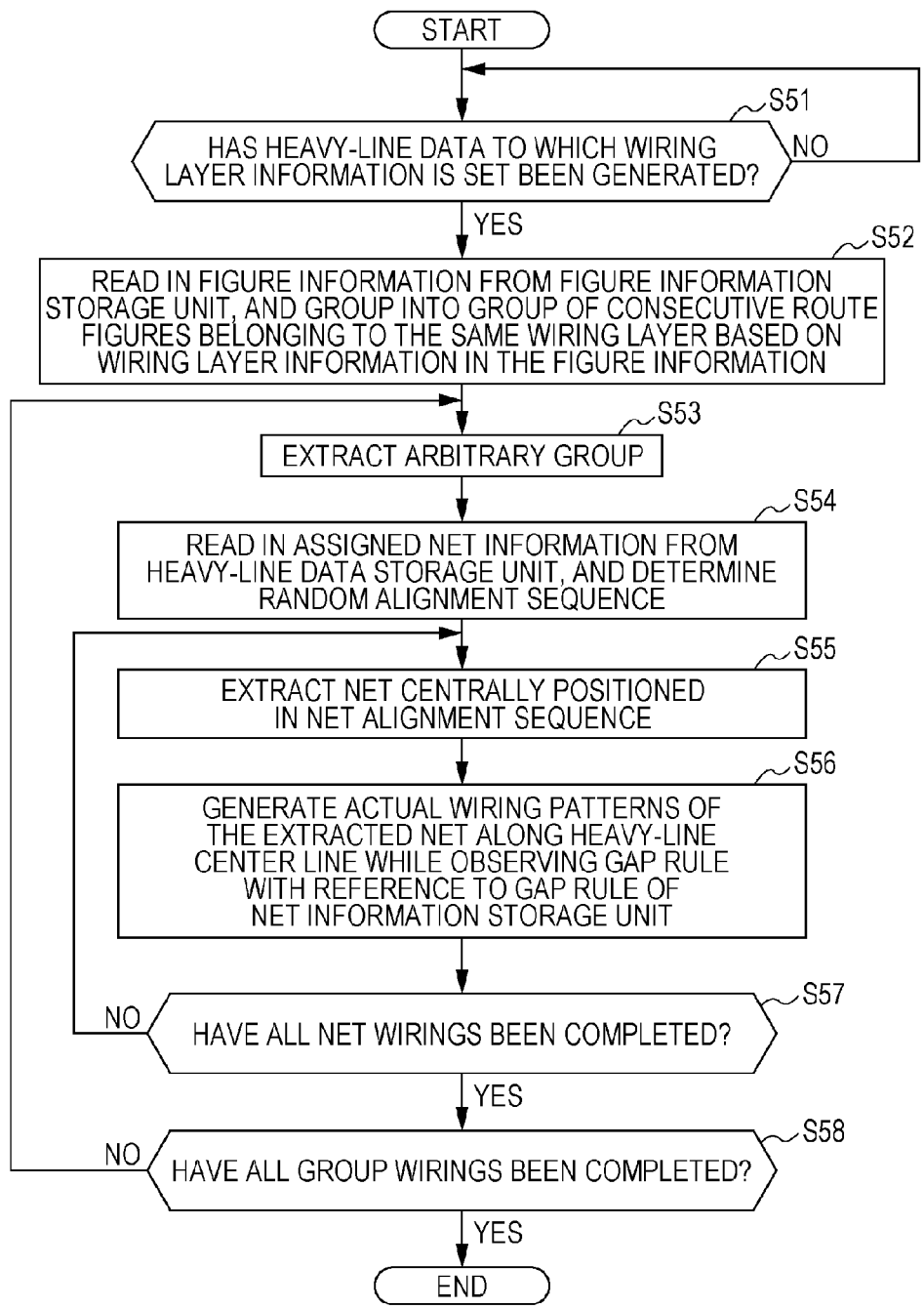
FIG. 14 is a method for describing a procedure for generating actual wiring patterns of which the wiring layer is to be changed, from a heavy line.

Next, description will be made regarding a procedure for generating actual wiring patterns where transfer to another wiring layer is performed, from a heavy line in accordance with the method illustrated in FIG. 14 (steps S51 through S58), with reference to FIGS. 13A and 13B.

In the event that a heavy line has been generated by the heavy-line generating unit 11 wherein wiring layer information is set for each route figure so as to change to another wiring layer in the middle of the processing, and route figures making up this heavy line have been obtained, the heavy-line generating unit 11 displays on the display unit 40, as illustrated in FIG. 13A, the heavy line made up of the route figures. Also, the heavy-line generating unit 11 holds the figure information of each route figure in the figure information storage unit 23 in a manner correlated with a figure information number for identifying each route figure.

Upon heavy-line data to which wiring layer information is set being generated using the function of the heavy-line generating unit 11 as described above (YES route in step S51), actual wiring patterns where transfer to another wiring layer is performed are generated from the heavy line as illustrated in FIG. 13B in the following sequence, by the function of the actual wiring pattern generating unit 12.

First, the actual wiring pattern generating unit 12 reads in figure information (wiring layer information) of each route figure belonging to the heavy line to be processed, from the figure information storage unit 23, and based on the wiring layer information, groups the multiple route figures into groups of consecutive route figures belonging to the same wiring layer (step S52). With the example illustrated in FIG. 13A, the two route figures are grouped to two of a group of the left-side route figure and a group of the right-side route figure.

The actual wiring pattern generating unit 12 then extracts one arbitrary group out of the multiple groups (step S53). The actual wiring pattern generating unit 12 generates actual wiring patterns and displays on the display unit 40 for each group based on the line width and gap rule of each net belonging to the extracted group in accordance with steps S54 through S57 in FIG. 14, as illustrated in FIG. 13B. At this time, as described above, actual wiring patterns in each route figure are displayed for each wiring layer with at least one of the display line type of the actual wiring patterns and the display color of the actual wiring patterns being changed. Thus, the designer can immediately visually confirm which wiring layer the actual wiring patterns are wired on. Note that the processes in steps S54 through S57 in FIG. 14 are basically the same as the processes in steps S12 through S15 in FIG. 4 respectively, detailed description thereof will be omitted. Also, the processes in steps S53 through S57 are repeatedly executed until these processes have been executed on all of the groups obtained in step S52, i.e., until YES determination is made in step S58 (NO route in step S58).

2-9. Transfer to Another Wiring Layer (Automatic Generation of Via)

Next, description will be made regarding a technique for generating actual wiring patterns where transfer to another wiring layer is performed, from a heavy line, and also generating a via for transfer to another wiring layer, with reference to FIGS. 15A through 15C. Now, description will be made regarding a procedure from a state illustrated in FIG. 13B until a via for transfer to another wiring layer is generated by the actual wiring pattern generating unit 12. Note that the following automatic generation of a via by the actual wiring pattern generating unit 12 is performed on all of the portions where the wiring layer of a net changes (a connected portion of two route figures) after completion of step S58 in FIG. 14, for example.

Figure 15A:
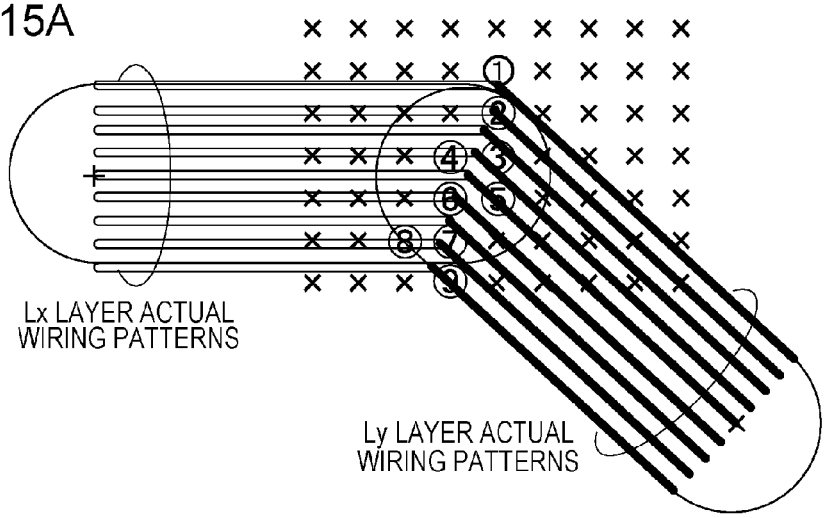
FIGS. 15A through 15C are diagrams for describing a technique for generating actual wiring patterns of which the wiring layer is to be changed, and also generating a via for change of the wiring layer, from a heavy line.

First, the actual wiring pattern generating unit 12 prolongs or reduces two sets of actual wiring patterns at a connected portion where actual wiring patterns are generated as illustrated in FIG. 13B, and obtains, as illustrated in FIG. 15A, an intersection between an actual wiring pattern on one route figure side and the corresponding actual wiring pattern on the other route figure side for each net.

Thereafter, the actual wiring pattern generating unit 12 selects a via grid closest to obtained each intersection. Here, let us say that nine via grids indicated with encircled numbers 1 through 9 have been selected regarding nine nets. Note that via grids are positions where a via (VIA) can be disposed, and are predetermined on a design stage of a printed circuit board, e.g., indicated with x-marks and encircled numbers 1 through 9 in FIGS. 15A through 15C.

The actual wiring pattern generating unit 12 adjusts the edge portions of two sets of actual wiring patterns so as to connect the nets via a selected via grid in the wiring layers Lx and Ly. That is to say, as illustrated in FIGS. 15B and 15C, the actual wiring pattern generating unit 12 reduces or prolongs wiring between the edge portion of each actual wiring pattern and a selected via grid, and connects the edge portion of each actual wiring pattern and the selected via grid.

Generation of a via and adjustment of wiring as described above may automatically be performed by the actual wiring pattern generating unit 12, or may be performed by the actual wiring pattern generating unit 12 under manual instructions of the designer from the input unit 30.

Figure 15B:
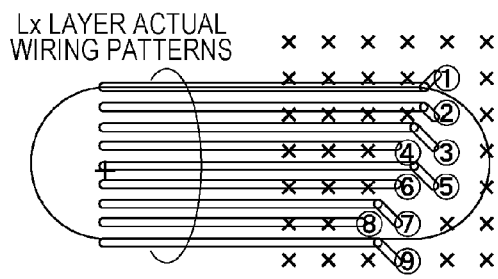
Figure 15C:
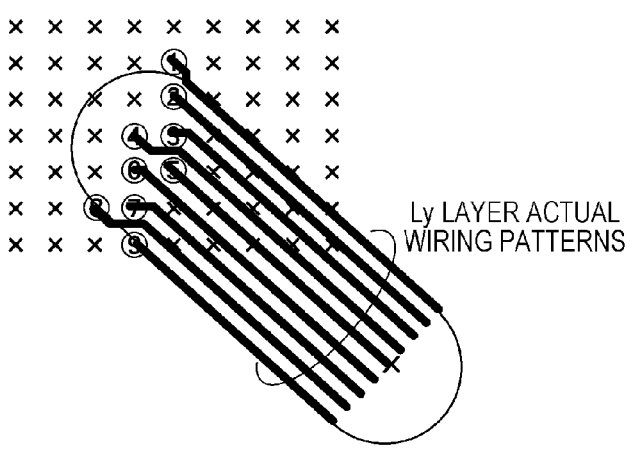

Also, as illustrated in FIGS. 15B and 15C, generation result of a via, and adjustment results of wiring are displayed on the display unit 40 along with the heavy line (route figures). At the time thereof, actual wiring patterns at each route figure are displayed for each wiring layer with at least one of the display line type of the actual wiring patterns and the display color of the actual wiring patterns being changed.

In this way, at the time of generating actual wiring patterns where transfer to another wiring layer is performed, from a heavy line, vias for transfer to another wiring layer are automatically generated and displayed, and accordingly, the designer can perform wiring study/wiring capacitance study in Section 2 in a more strict manner.

2-10. Various Modes When Generating Actual Wiring Patterns

Next, description will be made regarding various modes at the time of generating actual wiring patterns (random mode, compact mode, and user optional preset mode).

FIG. 16A is a diagram illustrating an example wherein actual wiring patterns have been generated in the random mode. With the wiring-design support device 1 according to the present embodiment, the random mode is a standard mode to be selected in the event that there is no instruction in particular from the designer, and is employed in step S12 in FIG. 4, step S32 in FIG. 8, and step S54 in FIG. 14 described above.

At the time of the random mode, as described above, the actual wiring pattern generating unit 12 reads in a net number belonging to the heavy line to be processed from the heavy-line data storage unit 21, determines the alignment sequence of net numbers at random, and generates actual wiring patterns as illustrated in FIG. 16A. With the example illustrated in FIG. 16A, ten nets belong to the heavy line to be processed, seven nets (see dashed line patterns) of the ten nets are wired in parallel in accordance with the first wiring rule (line width, gap), and the remaining three nets (see solid-line patterns) are wired in parallel in accordance with the second wiring rule different from the first wiring rule. As illustrated in FIG. 16A, in the random mode, the alignment sequence of nets are determined at random regardless of the wiring rule.

In the random mode, in the event that nets conforming to a different gap rule (nets which have a particularly great gap) are mixed, an area occupied by actual wiring patterns wired in parallel increases by order, as illustrated in FIG. 16A. Therefore, the random mode is not suitable for a case where the designer desires high-density wiring, but this mode provides room in the gaps of actual wiring patterns, and accordingly has an advantage wherein fine adjustment of line length for timing adjustment can readily be performed after generating actual wiring patterns.

FIG. 16B is a diagram illustrating an example wherein actual wiring patterns have been generated in the compact mode. The compact mode is a mode to be selected by the designer who desires high-density wiring inputting selection instructions from the input unit 30. At the time of selecting the compact mode, the actual wiring pattern generating unit 12 determines the alignment sequence of nets conforming to the gap rule of each net so as to minimize the widths of multiple nets included in the heavy line to be processed, and then generates actual wiring patterns based on the line width and gap rule of each net. Note that in the event that there are a pair of nets to which a differential signal flows, in the compact mode the actual wiring pattern generating unit 12 generates actual wiring patterns of this pair of nets so as to be certainly arrayed in pairs.

At this time, the actual wiring pattern generating unit 12 groups and arrays nets having the same type based on the gap rule, and also determines the alignment sequence of the nets so as to position the net having the greatest gap of the grouped net group, on the outermost side. Accordingly, in the event that seven nets conforming to a first wiring rule and three nets conforming to a second wiring rule belong to the heavy line to be processed, in the compact mode, e.g., as illustrated in FIG. 16B, the three nets conforming to the second wiring rule are disposed/generated on the upper side, and the seven nets conforming to the second wiring rule are disposed/generated on the lower side. Thus, the width of the net group is minimized, and the occupied area of the actual wiring patterns has a compact size.

The user optionally preset mode is a mode wherein the designer who is a user optionally sets the alignment sequence of nets belonging to the heavy line to be processed from the input unit 30. In the user optionally preset mode, the actual wiring pattern generating unit 12 determines the alignment sequence of multiple nets belonging to the heavy line to be processed in accordance with the instructions from the designer, and then generates actual wiring patterns based on the line width and gap rule of each net.

Figure 17:
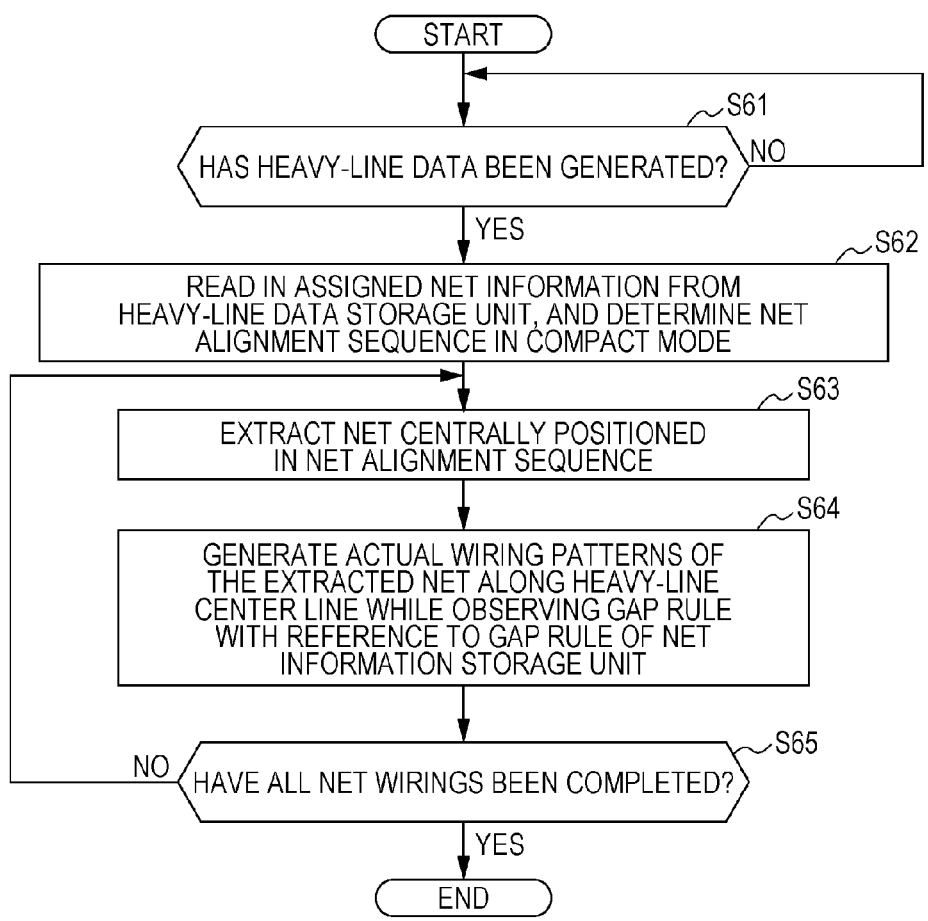
FIG. 17 is a method for describing a procedure for generating actual wiring patterns in the compact mode from a heavy line.

Next, description will be made regarding a procedure for generating actual wiring patterns from a heavy line in the compact mode in accordance with the method illustrated in FIG. 17 (steps S61 through S65).

Upon heavy-line data being generated by the heavy-line generating unit 11 (YES route in step S61), the actual wiring pattern generating unit 12 determines the alignment sequence of nets in the above-mentioned compact mode, and wires actual wiring patterns in the determined alignment sequence. That is to say, the actual wiring pattern generating unit 12 reads in net information (net numbers) belonging to the heavy line to be processed from the heavy-line data storage unit 21, and determines the alignment sequence of nets (net numbers) so as to minimize the widths of the multiple nets included in the heavy line to be processed in accordance with the gap rule of each net (step S62)

Thereafter, the actual wiring pattern generating unit 12 repeats the processes in steps S63 through S65, and accordingly, in the same way as with the processes in steps S13 through S15 in FIG. 4, as illustrated in FIG. 16B, actual wiring patterns of ten nets are sequentially generated along the heavy line to be processed, from the center side of the heavy line toward the outer side. In this way, the actual wiring patterns generated in the compact mode and the heavy line to be processed are displayed on the display unit 40 simultaneously. Thus, the designer can perform wiring study/wiring capacitance study with reference to the actual wiring patterns in a state in which the area occupied by the actual wiring patterns is reduced to a compact size.

2-11. Modifications

With the present embodiment, prior to Section 1 and Section 3, a heavy line and actual wiring patterns in Section 2 are generated and displayed on the display unit 40. On the other hand, now, an adjustment technique to be applied to a case where detailed wiring in Section 1 and Section 3 has been performed prior to generation of actual wiring patterns in Section 2 will be described with reference to FIG. 18 as a modification of the present embodiment. Note that upper part and lower part of FIG. 18 are diagrams for describing a technique for adjusting the alignment sequence of actual wiring patterns in accordance with the alignment lead wirings from a component pin.

Figure 18:
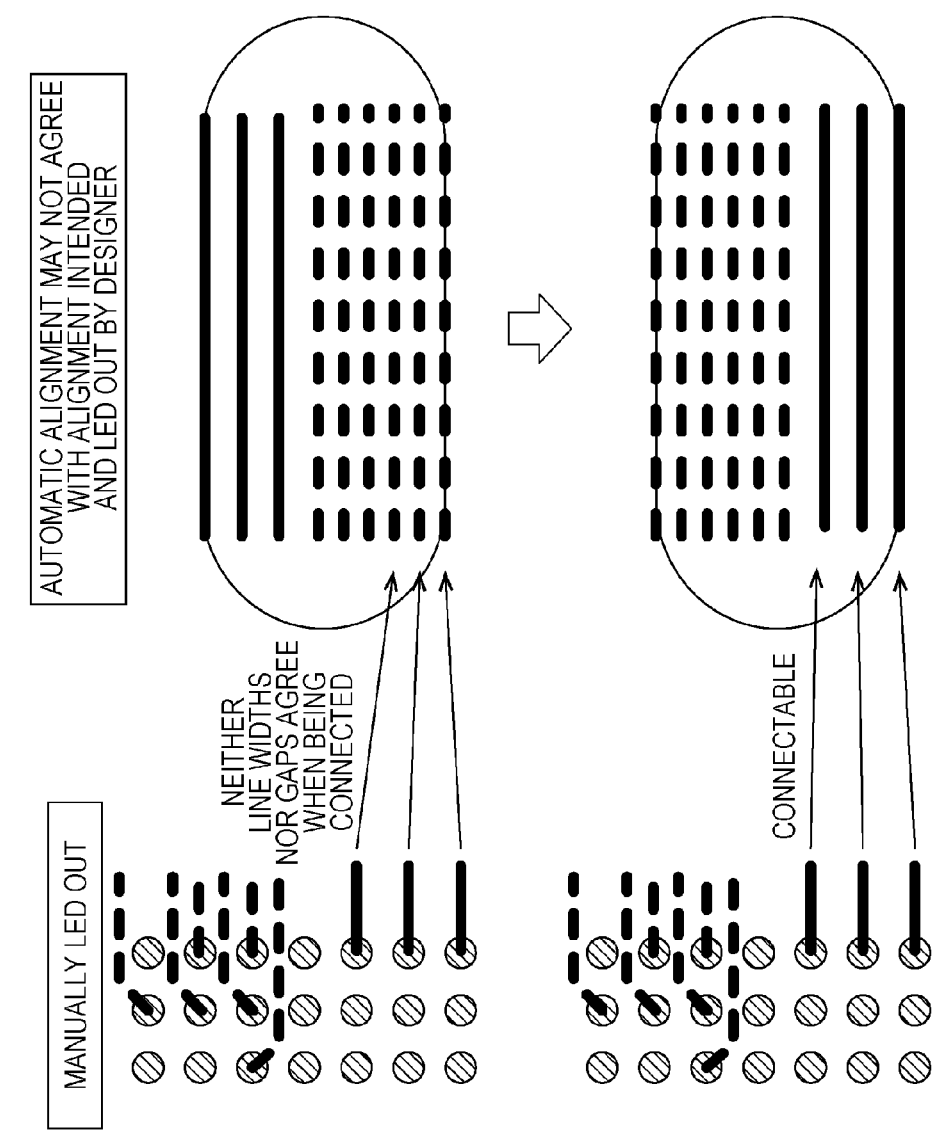
FIG. 18 is a diagram for describing a technique for adjusting the alignment sequence of actual wiring patterns in accordance with the alignment of leading-out wirings from component pins.

For example, as illustrated in the left sides of upper part and lower part of FIG. 18, let us say that lead wires from component terminals toward out of the component have been manually wired in Section 1 or Section 3. At this time, six lead wires on the upper side (see dashed-line patterns) are wired in parallel in accordance with a first wiring rule (line width, gap), and three lead wires on the lower side (see solid-line patterns) are wired in parallel in accordance with a second wiring rule different from the above first wiring rule.

In such a state, let us consider a case where, as illustrated in on the right side of upper part and lower part of FIG. 18, three actual wiring patterns (see solid lines) conforming to the second wiring rule are wired on the upper side, and six actual wiring patterns (see solid lines) conforming to the first wiring rule are wired on the lower side, by the actual wiring pattern generating unit 12. In this case, as illustrated in upper part of FIG. 18, upon the lead wires in Section 1 or Section 3 and the actual wiring patterns belonging to the heavy line being connected without changing the alignment sequence, the wiring rule of the lead wires and the wiring rule of the actual wiring patterns differ, and accordingly, the lead wires and actual wiring patterns do not agree in line widths and gaps. That is to say, in the event that the alignment sequence of nets belonging to a heavy line is automatically determined in compact mode, this alignment sequence may not agree with the alignment sequence of lead wires which the designer has intentionally led.

In order to handle such a case, with the present embodiment, the actual wiring pattern generating unit 12 has a function for automatically adjusting the alignment sequence of actual wiring patterns in Section 1 in accordance with the alignment sequence of the lead wires in Section 1 or Section 3. For example, as illustrated in upper part of FIG. 18, in the event that the alignment sequences of the lead wires and actual wiring patterns do not agree, the actual wiring pattern generating unit 12 replaces the three actual wiring patterns conforming to the second wiring rule disposed on the upper side with the six actual wiring patterns conforming to the first wiring rule disposed on the lower side as illustrated in lower part of FIG. 18.

Thus, even in the event that the alignment sequences of the conventional wirings and actual wiring patterns do not agree, according to the actual wiring pattern generating unit 12, the alignment sequence of the actual wiring patterns in Section 2 can be automatically adjusted to equalize the alignment sequences of the conventional wirings and actual wiring patterns, and the designer's convenience can be improved.

2-12. Series of Actual Wiring Pattern Generating Procedure

Figure 19:
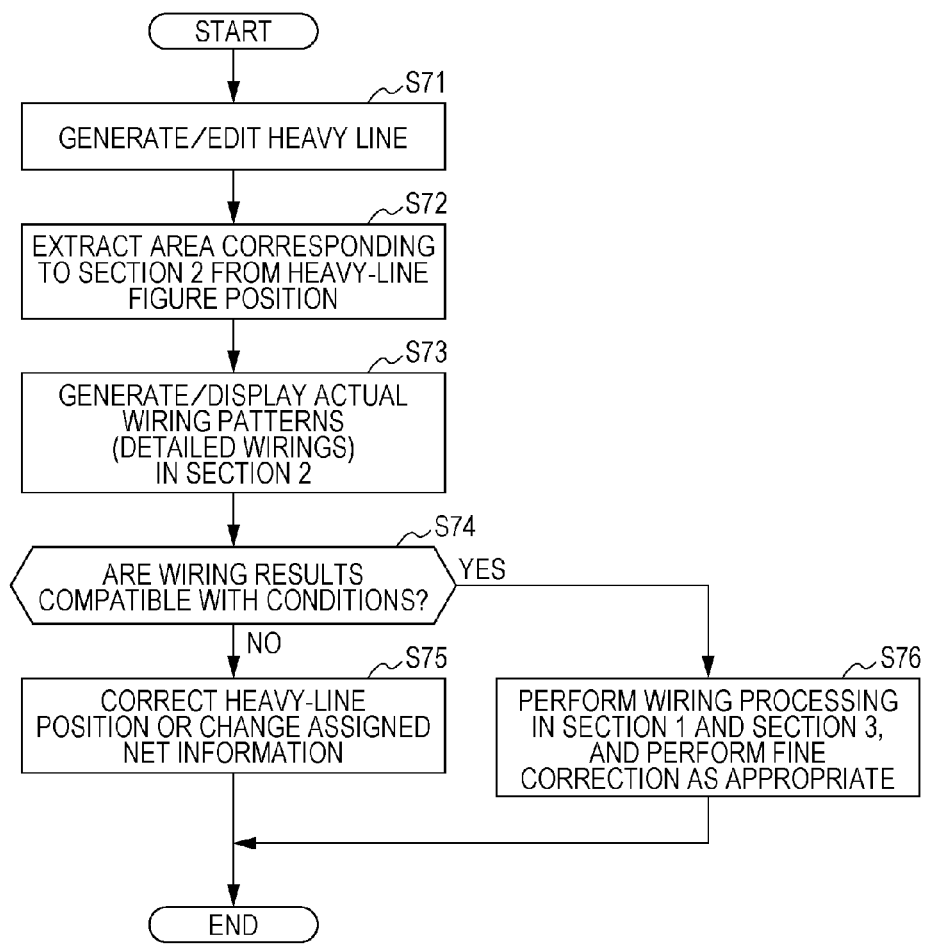
FIG. 19 is a method for describing a series of actual wiring pattern generating procedure using the wiring-design support device according to the present embodiment.
Figure 20:
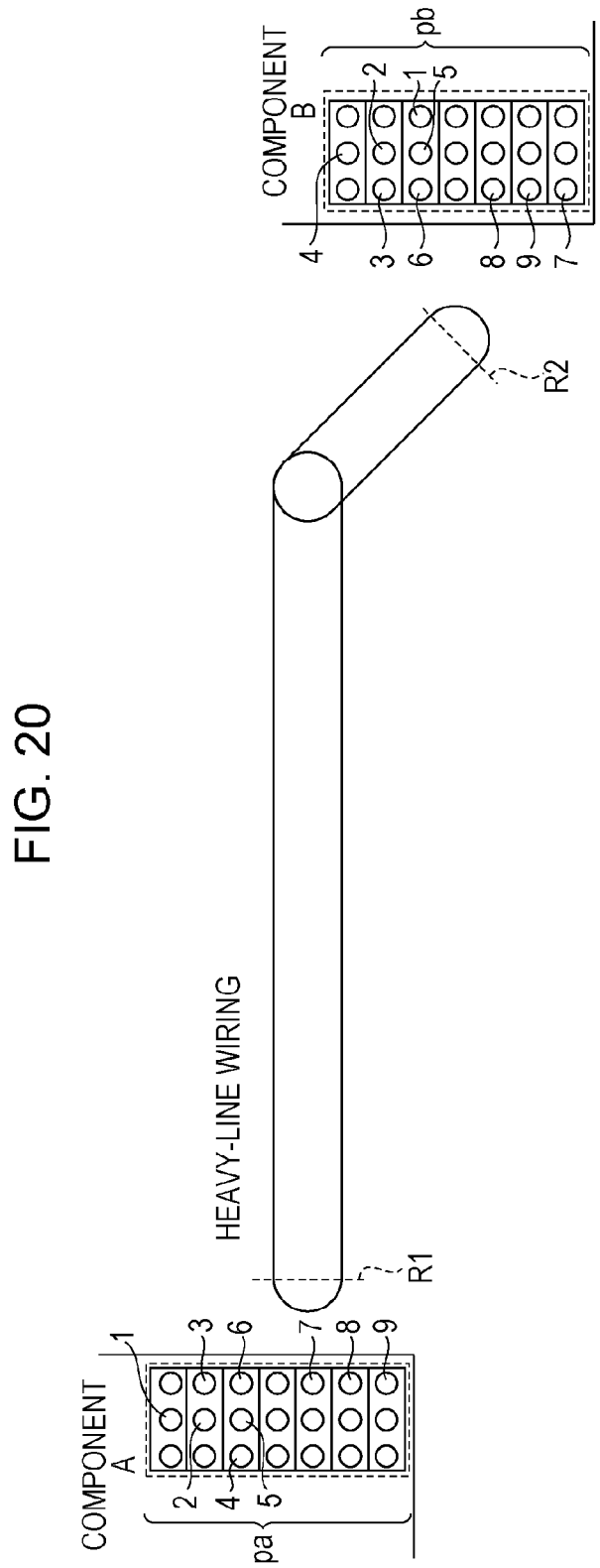
FIG. 20 is a diagram illustrating a generated and displayed example of a heavy line.
Figure 21C:
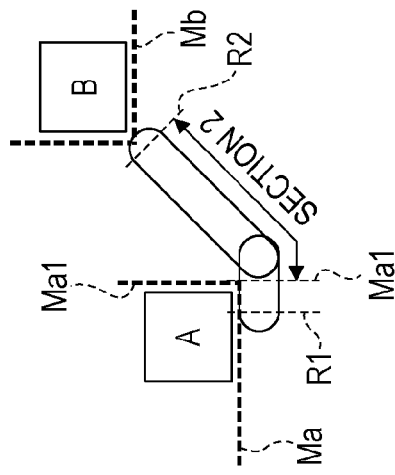
FIGS. 21A through 21C are diagrams for describing a technique for extracting a section where actual wiring patterns are to be generated, from a generated and displayed heavy line.
Figure 21B:
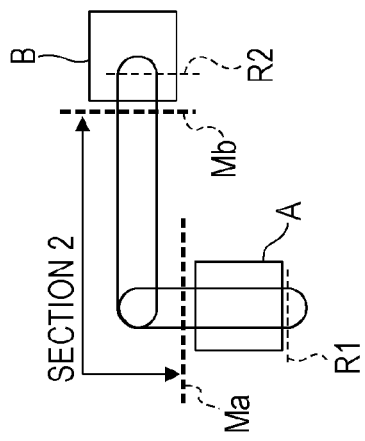
Figure 21A:
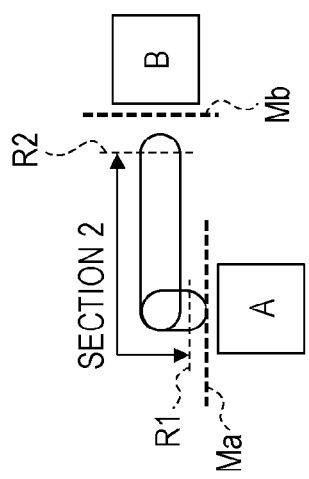
Figure 23:
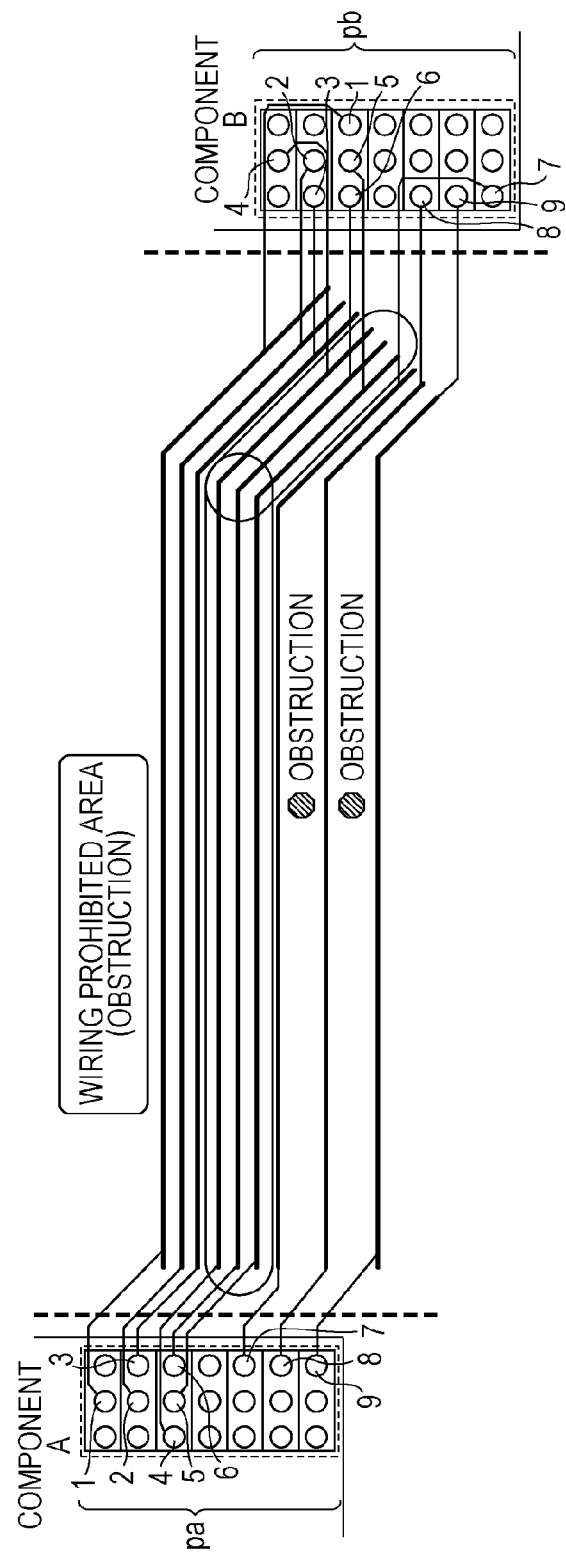
FIG. 23 is a diagram illustrating an example wherein actual wiring patterns in Section 1 and Section 3 have been generated and displayed, regarding the example illustrated in FIG. 22.
Figure 24:
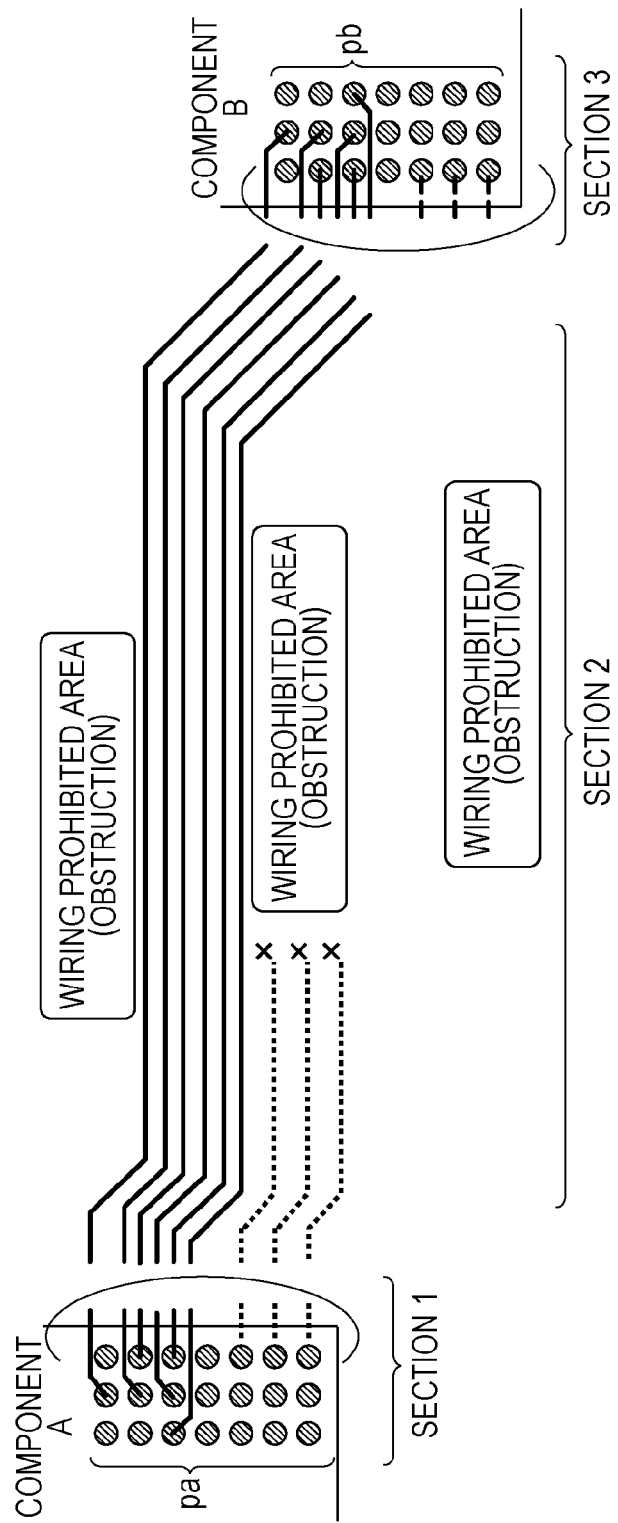
FIG. 24 is a diagram for describing an example of a conventional wiring-design technique.
Figure 25A:
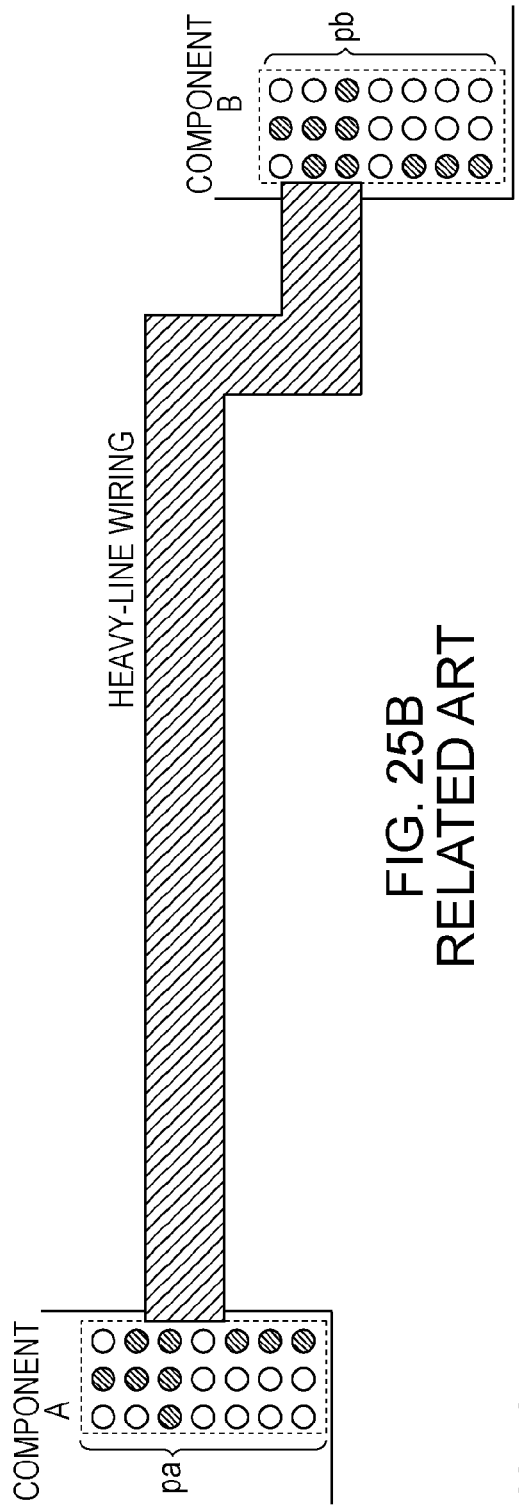
FIGS. 25A and 25B are diagrams for describing another example of a conventional wiring-design technique.
Figure 25B:
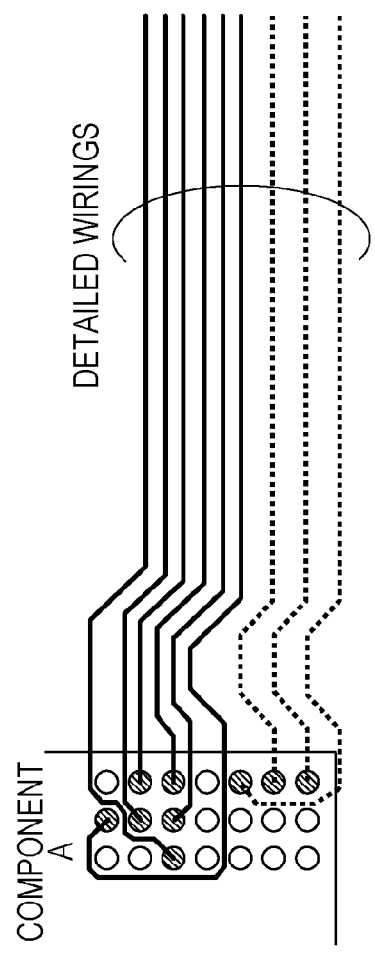

Next, description will be made regarding a series of actual wiring pattern generating procedure using the wiring-design support device 1 according to the present embodiment in accordance with the method illustrated in FIG. 19 (steps S71 through S76), with reference to FIGS. 20 through 23. Note that FIG. 20 is a diagram illustrating a generated and displayed example of a heavy line, and FIGS. 21A through 21C are diagrams for describing a technique for extracting an area where actual wiring patterns are generated from a generated and displayed heavy line. Also, FIG. 22 is a diagram illustrating an example wherein actual wiring patterns have been generated and displayed from the heavy line regarding the example illustrated in FIG. 20, and FIG. 23 is a diagram illustrating an example wherein actual wiring patterns in Section 1 and Section 3 have been generated and displayed regarding the example illustrated in FIG. 22.

With the wiring-design support device 1 according to the present embodiment, prior to the wiring processing in Section 1 and Section 3, first, between a component A and a component B, a wiring route which expresses a bus signal as one heavy line is generated by the heavy-line generating unit 11 using automatic or manual figure editing and displayed on the display unit 40, as illustrated in FIG. 20 (step S71). Note that with the examples illustrated in FIGS. 20, 22, and 23, actual wiring patterns have been generated so that pins denoted with reference numerals 1 through 9 of the component pins pa of the component A are connected to pins denoted with reference numerals 1 through 9 of the component pins pb of the component B, respectively.

Next, an area in Section 2 where actual wiring patterns have to be generated is extracted from the heavy line generated and displayed in FIG. 20 by the heavy-line generating unit 11 (step S72). With the example illustrated in FIG. 20, as described above with reference to Part B of FIG. 3, an area between the edge point positions R1 and R2 of both edges of the heavy line is extracted as Section 2.

Now, description will be made regarding a technique for extracting a section where actual wiring patterns are generated, from a generated and displayed heavy line as Section 2, with reference to FIGS. 21A through 21C. Note that, as illustrated in FIGS. 21A through 21C, margins Ma (Ma1) and Mb which regulate penetration of actual wiring patterns in Section 2 are preset to the outer circumferences of the components A and B, respectively.

As illustrated in FIGS. 21A and 20, unless the edge point positions R1 and R2 of both edges of the heavy line have exceeded the margins Ma and Mb and have penetrated the components A and B side, an area between the edge point positions R1 and R2 of both edges of the heavy line is extracted as Section 2. Also, as illustrated in FIG. 21B, in the event that the edge point positions R1 and R2 of both edges of the heavy line have exceeded the margins Ma and Mb and have penetrated the components A and B side, an area between the margins Ma and Mb of the area of the heavy line is extracted as Section 2. Further, as illustrated in FIG. 21C, in the event that one edge side of the heavy line is adjacent to the margin Ma, and the edge point position R2 on the other edge side of the heavy line has not exceeded the margin Mb and has not penetrated the component B side, an area between the margin Ma1 and the edge point position R2 of the area of the heavy line is extracted as Section 2.

In this way, with the present embodiment, Section 2 serving as an area where actual wiring patterns are generated in a range not exceeding the margins Ma and Mb is extracted. Thus, even in the event that the designer has manually roughly generated a heavy line, the range not exceeding the margins Ma and Mb is extracted as Section 2, and accordingly, actual wiring patterns in Section 2 are generated without exceeding the margins Ma and Mb.

Next, actual wiring patterns (detailed wirings) of nets belonging to the heavy line are generated by the actual wiring pattern generating unit 12 within the range of Section 2 extracted in step S72, and are displayed on the display unit 40 along with the heavy line (step S73). With the example illustrated in FIG. 22, the above-mentioned shape quality mode has been selected. Therefore, the actual wiring pattern generating unit 12 has generated actual wiring patterns so that an actual wiring pattern which bypasses an obstruction or wiring prohibited area, and an actual wiring pattern which does not bypass an obstruction or wiring prohibited area have an equal length.

The designer performs wiring study/wiring capacitance study without taking Section 1 and Section 3 into consideration at the same time with reference to the heavy line and actual wiring patterns in Section 2 on the display unit 40. As results of the study, in the event that determination is made that the wiring processing results of the heavy line and actual wiring patterns are incompatible with the conditions (NO route in step S74), the position of the heavy line are corrected, or nets belonging to the heavy line are changed, automatically or manually (step S75). After this, the processing unit 10 returns the processing in step S71, and repeatedly executes the processes in steps S71 through S75.

As results of the study, in the event that determination is made that the wiring processing results of the heavy line and actual wiring patterns are compatible with the conditions (YES route in step S74), the processing unit 10 executes, as illustrated in FIG. 23, wiring processing in Section 1, and wiring processing in Section 3 (step S76). The wiring processes in Section 1 and Section 3 are automatically or manually executed using an conventional algorithm such as a linear search method or MAXFLOW or the like. With the wiring process in Section 1, between the component pins pa of the component A and the edge portion on the component A side of the actual wiring patterns in Section 2 is connected, and with the wiring process in Section 3, between the component pins pb of the component B and the edge portion on the component B side of the actual wiring patterns in Section 2 is connected. At this time, fine correction of the actual wiring patterns generated in Section 2 is also executed as appropriate. Fine correction of the actual wiring patterns is correction wherein, for example, in the event that there is a useless actual wiring pattern ahead of a connection portion between the actual wiring patterns in Section 2 and the lead wires from the component pins pa and pb, the useless actual wiring pattern is deleted.

In the way described above, bundle wiring from the component pins pa of the component A to the component pins pb of the component B is realized.

Note that determination in step S74 may be performed by the designer or may be automatically performed by the processing unit 10 based on a predetermined threshold.

3. Advantage of Wiring-design Support Device According to Present Embodiment

According to the wiring-design support device 1 according to the present embodiment, the following operation advantages are obtained.

(1) Wiring processing of a heavy line and actual wiring patterns in Section 2 is performed at high speed while taking Section 2 alone into consideration without taking Section 1 and Section 3 into consideration, and accordingly, wiring study/wiring capacitance study in Section 2 can be performed strictly at high speed. As results of the study, in the event that the wiring state of a heavy line has been changed, wiring study/wiring capacitance study in Section 2 is repeatedly performed at high speed, and accordingly, more strict study can be performed at short times.

(2) The designer just specifies the number of nets, and accordingly, a simplified heavy line in Section 2, and actual wiring patterns of tentative nets belonging to this simplified heavy line are generated at high speed and displayed at the same time on the display unit 40. Accordingly, even in the event that signal wires included in a bundle line have not been determined in detail, wiring study/wiring capacitance study can schematically be performed.

(3) The designer can perform wiring according to conditions by selecting the heavy-line pasting mode in the event of prioritizing high-density wiring over timing precision, and by selecting the shape quality mode in the event of improving timing precision.

(4) Actual wiring patterns in Section 2 are changed in conjunction with or following editing of a heavy line and are displayed on the display unit 40 along with the heavy line after editing. Accordingly, the designer can repeatedly perform wiring study/wiring capacitance study in Section 2 at high speed while performing editing of the heavy line, and can perform more strict study.

(5) Section 2 is optionally segmentalized, a heavy line or simplified heavy line and actual wiring patterns are generated and displayed for each segmentalized portion, and the designer can perform wring study/wiring capacitance study with reference to display thereof. After performing wring study/wiring capacitance study for each portion, according to the designer's coupling instructions, the heavy line and simplified heavy line are coupled via a coupling heavy line as appropriate, actual wiring patterns along a series of heavy lines after coupling are generated and displayed, and accordingly, the designer's convenience can be improved.

(6) Section 2 is optionally segmentalized, a first simplified heavy line and a second simplified heavy line are generated and displayed for each segmentalized portion, and the designer can perform wiring study/wiring capacitance study with reference to display thereof. After performing wring study/wiring capacitance study for each portion, according to the designer's coupling instructions, the first simplified heavy line and second simplified heavy line are coupled via a coupling heavy line as appropriate, actual wiring patterns along a series of simplified heavy lines after coupling are generated and displayed, and accordingly, the designer's convenience can be improved.

(7) Based on wiring layer information set to each route figure, actual wiring patterns are generated and displayed on the display unit 40 for each wiring layer. At this time, actual wiring patterns at each route figure are displayed for each wiring layer with at least one of the display line type of the actual wiring patterns and the display color of the actual wiring patterns being changed. Thus, the designer can immediately visually confirm on which wiring layer actual wiring pattern are wired.

(8) At the time of generating actual wiring patterns where transfer to another wiring layer is performed, from a heavy line, a via for transfer to another wiring layer is automatically generated and displayed, and accordingly, the designer can more strictly perform wiring study/wiring capacitance study in Section 2.

4. Others

Though suitable embodiments have been described in detail so far, the present disclosure is not restricted to such particular embodiments, and various modifications and changes can be made without departing from the essence of the present disclosure.

Note that all or a part of various functions of the wiring-design support device 1 according to the present embodiment including the above-mentioned heavy-line generating unit (wiring route generating unit) 11 and actual wiring pattern generating unit (detailed wiring generating unit) 12 are realized by a computer (including CPU, information processing device, and various terminals) executing a predetermined application program (wiring-design support program).

The program thereof is provided in a mode recorded in a computer-readable recording medium, e.g., such as a flexible disk, CD (CD-ROM, CD-R, CD-RW, etc.), DVD (DVD-ROM, DVD-RAM, DVD-R, DVD-RW, DVD+R, DVD+RW, etc.), Blu-ray Disc (registered trademark), or the like. In this case, the computer uses the program by reading the program from the recording medium thereof, transferring to an internal storage device or external storage unit to store therein.

The computer mentioned here is conception including hardware and OS (Operating System), and means hardware which operates under the control of an OS. Also, in the event of operating hardware using an application program alone without an OS, the hardware thereof itself is equivalent to the computer. Hardware includes at least a microprocessor such as a CPU or the like, and a unit to read a computer program recorded in a recording medium. The above-mentioned wiring-design support program includes program code which causes a computer as described above to realize various functions of the wiring-design support device 1 according to the present embodiment including the heavy-line generating unit (wiring route generating unit) 11 and actual wiring pattern generating unit (detailed wiring generating unit) 12. Also, part of the functions thereof may be realized not by an application program but by an OS.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A wiring-design support device that supports wiring design of a printed circuit board, comprising:
a processor; and
a memory coupled to the processor, wherein the processor executes a process including:
classifying a wiring area between two components into a plurality of sections;
generating a wiring route illustrating a section of the wiring area where a plurality of signal wires are wired between the two components based on wiring information relating to the plurality of signal wires to be wired in parallel between two components on the printed circuit board stored in the memory, prior to a processing for wiring a lead wire to be led out from each component terminal of the two components and to be connected with edge portions of the plurality of signal wires, and displaying the wiring route on a display; and
generating, upon or after the wiring route is generated, a detailed wiring of the section of the wiring area before generating a wiring route for other sections of the plurality of sections of the wiring area, where each of the plurality of signal wires is wired along the wiring route based on the wiring route and a wiring rule included in the wiring information and displaying, on the display, the detailed wiring corresponding with the wiring route,
wherein the section of the wiring area generated is wired independently of the other sections of the plurality of sections of the wiring area.

2. The wiring-design support device according to claim 1, wherein, when the wiring route is edited in the generating of the wiring route in a state which both of the wiring route and the detailed wiring are displayed on the display, the generating of the detailed wiring regenerates the detailed wiring based on the wiring route after editing and the wiring rule, and displays the detailed wiring on the display corresponding with the wiring route after editing.

3. The wiring-design support device according to claim 1, wherein the wiring rule includes a line width and a gap rule of each of the plurality of signal wires,
the generating of the wiring route calculates a width of the wiring route based on the line width and the gap rule of each of the plurality of signal wires, and generates the width of the wiring route, and
the generating of the detailed wiring generates the detailed wiring based on the line width and gap rule of each of the plurality of signal wires.

4. The wiring-design support device according to claim 3, wherein the generating of the wiring route calculates, as the width of the wiring route, a minimum width of the plurality of signal wires in a case of disposing the plurality of signal wires in accordance with the gap rule of each signal wire, and generates the wiring route having the minimum width.

5. The wiring-design support device according to claim 3, wherein the generating of the detailed wiring determines an alignment sequence of the plurality of signal wires at random, and then generates the detailed wiring based on the line width and the gap rule of each of the plurality of signal wires.

6. The wiring-design support device according to claim 3, wherein the generating of the detailed wiring determines an alignment sequence of the plurality of signal wires in accordance with the gap rule of each signal wire so as to minimize widths of the plurality of signal wires, and then generates the detailed wiring based on the line width and gap rules of each of the plurality of signal wires.

7. The wiring-design support device according to claim 3, wherein the generating of the detailed wiring determines an alignment sequence of the plurality of signal wires in accordance with instructions from a user, and then generates the detailed wiring based on the line width and gap rule of each of the plurality of signal wires.

8. The wiring-design support device according to claim 1, wherein the memory stores a number of the plurality of signal wires, a certain simplified line width and a certain simplified gap serving as the wiring rule,
the generating of the wiring route calculates a width of the wiring route based on the number of the plurality of signal wires, the certain simplified line width, and the certain simplified gap, and generates the wiring route having the width as a simplified wiring route, and
the generating of the detailed wiring generates the detailed wiring based on the certain simplified line width and the certain simplified gap, and the display displays the simplified wiring route.

9. The wiring-design support device according to claim 8, wherein, in a case that the wiring route and the simplified wiring route are coupled by the generating of the wiring route in a state where the wiring route, the detailed wiring regarding the wiring route, the simplified wiring route, and the detailed wiring regarding this simplified wiring route are displayed on the display,
the generating of the wiring route changes the simplified wiring route in a state conforming to the wiring route to be displayed and also generates a coupling wiring route confirming to the wiring route which couples the wiring route after change and the wiring route to be displayed on the display, and
the generating of the detailed wiring generates a detailed wiring to be displayed along with the coupling wiring and the wiring route after the change where each of the plurality of signal wires is wired along the coupling wiring route and the wiring route after change based on the coupling wiring route, the wiring route after change, and the wiring rule.

10. The wiring-design support device according to claim 8, wherein, a first simplified wiring route and the detailed wiring regarding the first simplified wiring route, and a second simplified wiring route and the detailed wiring regarding the second simplified wiring route are displayed on the display when the first simplified wiring route and the second simplified wiring route are coupled by the generating of the wiring route,
the generating of the wiring route changes the second simplified wiring route to a state conforming to the first simplified wiring route to display on the display, and also generates a coupling simplified wiring route conforming to the first simplified wiring route which couples the second simplified wiring route after change and the first simplified wiring route to display on the display, and
the generating of the detailed wiring generates a detailed wiring where each of the plurality of signal wires is wired along the coupling simplified wiring route and the second simplified wiring route after change based on the coupling simplified wiring route and the second simplified wiring route after change, and displays a wiring rule regarding the first simplified wiring route on the display along with the coupling simplified wiring route and the second simplified wiring route after change.

11. The wiring-design support device according to claim 1, wherein the generating of the detailed wiring generates the detailed wiring in a pasting mode in which a detour route is made by wiring being performed in a manner pasting in a wiring prohibited area and the wiring route.

12. The wiring-design support device according to claim 11, wherein the generating of the detailed wiring corrects, in the case that a quality preferential mode has been selected, the detailed wiring generated in the pasting mode so as to equalize the lengths of the plurality of signal wires.

13. The wiring-design support device according to claim 1, wherein the wiring route is displayed in a state in which a plurality of route figures are coupled.

14. The wiring-design support device according to claim 13, wherein each of the plurality of the route figures is formed of two semicircles having the same diameter that is disposed so as to face both edge portions and two straight lines that connect the both edge portions.

15. The wiring-design support device according to claim 13, wherein wiring layer information of the printed circuit board is set to each of the plurality of the route figures, and the generating of the detailed wiring generates the detailed wiring for each wiring layer based on the wiring layer information set to each route figure.

16. The wiring-design support device according to claim 15, wherein, in the case that two coupled route figures include in a different wiring layer, the generating of the detailed wiring obtains an intersection of two sets of the detailed wirings generated regarding the two route figures for each signal wire, selects a via grid closest to each obtained intersection, and adjusts the two sets of the detailed wirings so as to connect the signal wires via the selected via grid.

17. The wiring-design support device according to claim 1, wherein
the plurality of sections includes a first section, a second section and a third section,
the first section contacts with one of the two components, the third section contacts with the other of the two components, and the second section locates between the first section and the third section, and
after the detailed wiring is generated in the second section, the processing for wiring the lead wire in the first section or the third section is performed.

18. A computer-readable recording medium having stored therein a program causing a computer to execute a process to support wiring design of a printed circuit board, the process comprising:
classifying a wiring area between two components into a plurality of sections;
generating a wiring route illustrating a section of the wiring area where a plurality of signal wires are wired between the two components based on wiring information including information relating to the plurality of signal wires to be wired in parallel between two components on the printed circuit board stored prior to a processing for wiring a lead wire to be led out from each component terminal of the two components and to be connected with an edge portion of the plurality of signal wires, and displaying on a display; and
generating of, upon or after the wiring route is generated, a detailed wiring of the section of the wiring area before generating a wiring route for other sections of the plurality of sections of the wiring area, where each of the plurality of signal wires is wired along the wiring route based on the wiring route and a wiring rule included in the wiring information, and displaying the detailed wiring on the display corresponding with the wiring route,
wherein the section of the wiring area generated is wired independently of the other sections of the plurality of sections of the wiring area.

19. A method to support wiring design of a printed circuit board by using a computer, the method comprising:
classifying a wiring area between two components into a plurality of sections;
generating, using the computer, a wiring route illustrating a section of the wiring area where a plurality of signal wires are wired between the two components based on wiring information including information relating to the plurality of signal wires to be wired in parallel between two components on the printed circuit board stored in the computer prior to processing for wiring a lead wire to be led out from each component terminal of the two components, and to be connected with an edge portion of the plurality of signal wires, and displaying the wiring route on a display; and
generating, using the computer, upon or after the wiring route is generated, a detailed wiring of the section of the wiring area before generating a wiring route for other sections of the plurality of sections of the wiring area where each of the plurality of signal wires is wired along the wiring route based on the wiring route and a wiring rule included in the wiring information, and displaying, on the display, the detailed wiring corresponding with the wiring route,
wherein the section of the wiring area generated is wired independently of the other sections of the plurality of sections of the wiring area.

20. The method according to claim 19, wherein
the plurality of sections includes a first section, a second section and a third section,
the first section contacts with one of the two components, the third section contacts with the other of the two components, and the second section locates between the first section and the third section, and
after the detailed wiring is generated in the second section, the processing for wiring the lead wire in the first section or the third section is performed.

* * * * *

UNITED STATES PATENT AND TRADEMARK OFFICE
CERTIFICATE OF CORRECTION

PATENT NO. : 8,793,643 B2  Page 1 of 1
APPLICATION NO. : 13/625300
DATED : July 29, 2014
INVENTOR(S) : Yoshitaka Nishio et al.

It is certified that error appears in the above-identified patent and that said Letters Patent is hereby corrected as shown below:

In the Claims,

Column 30, Line 40, In Claim 19, delete "sections of the wiring area" and insert -- sections of the wiring area, --, therefor.

Signed and Sealed this
Twenty-eighth Day of October, 2014

Michelle K. Lee
*Deputy Director of the United States Patent and Trademark Office*